United States Patent
Kim et al.

(10) Patent No.: US 9,263,495 B2
(45) Date of Patent: Feb. 16, 2016

(54) IMAGE SENSOR AND FABRICATING METHOD THEREOF

(71) Applicant: Samsung Electronics Co., Ltd., Suwon-si, Gyeonggi-do (KR)

(72) Inventors: Sungkwan Kim, Hwaseong-si (KR); Soo-Kyung Kim, Seongnam-si (KR); Jung-kuk Park, Anyang-si (KR); Myung-Sun Kim, Hwaseong-si (KR); Jaesung Yun, Suwon-si (KR); Junetaeg Lee, Suwon-si (KR); Hakyu Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/554,511

(22) Filed: Nov. 26, 2014

(65) Prior Publication Data

US 2015/0145088 A1 May 28, 2015

(30) Foreign Application Priority Data

Nov. 28, 2013 (KR) ........................ 10-2013-0146393

(51) Int. Cl.
*H01L 21/00* (2006.01)
*H01L 27/146* (2006.01)

(52) U.S. Cl.
CPC .... *H01L 27/14645* (2013.01); *H01L 27/14621* (2013.01); *H01L 27/14627* (2013.01); *H01L 27/14685* (2013.01)

(58) Field of Classification Search
CPC ................. H01L 27/14621; H01L 27/14627; H01L 27/14645; H01L 27/14685
USPC ..................................... 438/48, 70
See application file for complete search history.

(56) References Cited

U.S. PATENT DOCUMENTS

| 6,379,992 | B2* | 4/2002 | Jo ..................... H01L 27/14609 257/E27.132 |
| 7,364,936 | B2* | 4/2008 | Hong ................ H01L 27/14621 257/E27.134 |
| 7,537,868 | B2 | 5/2009 | Suzuki |
| 8,357,906 | B2 | 1/2013 | Hanfoug |
| 8,513,048 | B2 | 8/2013 | Yun |
| 2006/0292731 | A1 | 12/2006 | Kim |
| 2008/0157246 | A1* | 7/2008 | Han ................... H01L 27/14621 257/432 |
| 2008/0286896 | A1 | 11/2008 | Jung |
| 2009/0303359 | A1 | 12/2009 | Otsuka et al. |
| 2011/0026153 | A1 | 2/2011 | Yoshibayashi |

FOREIGN PATENT DOCUMENTS

JP        2006-163316     6/2006
KR    1020070000102     1/2007

(Continued)

*Primary Examiner* — Hung Vu
(74) *Attorney, Agent, or Firm* — Myers Bigel Sibley & Sajovec, PA

(57) ABSTRACT

A method of fabricating an image sensor is provided. The method may include preparing a substrate with first to third pixel regions, coating a first color filter layer on the substrate, sequentially forming a first sacrificial layer and a first protection layer to cover the first color filter layer, forming a first photoresist pattern on the first protection layer to be overlapped with the first pixel region, performing a first dry etching process using the first photoresist pattern as an etch mask to the first sacrificial layer and the first protection layer to form a first color filter, a first sacrificial pattern, and a first protection pattern sequentially stacked on the first pixel region, and selectively removing the first sacrificial pattern to separate the first protection pattern from the first color filter.

13 Claims, 40 Drawing Sheets

(56) References Cited

FOREIGN PATENT DOCUMENTS

| KR | 1020090066408 | 6/2009 |
| KR | 1020100030494 | 3/2010 |
| KR | 1020100076292 | 7/2010 |
| KR | 20100116219 | 10/2010 |

* cited by examiner

1000

2000

IMAGE SENSOR AND FABRICATING METHOD THEREOF

CROSS-REFERENCE TO RELATED APPLICATIONS

This U.S. non-provisional patent application claims priority under 35 U.S.C. §119 to Korean Patent Application No. 10-2013-0146393, filed on Nov. 28, 2013, the entire contents of which are hereby incorporated by reference herein.

FIELD

Example embodiments of the inventive concept relate to an image sensor and a fabrication method thereof, and in particular, to an image sensor with improved resolution and a method of fabricating the same.

BACKGROUND

Some image sensors are semiconductor devices capable of converting electric signals into optical images. These image sensors may be classified into various types, including a charge-coupled device (CCD) type and a complementary metal-oxide-semiconductor (CMOS) type.

As an integration density of the image sensor increases, the size of each pixel in the image sensor decreases. This may lead to various technical problems in a process of forming color filters on the pixels.

SUMMARY

Example embodiments of the inventive concept provide an image sensor with improved resolution.

Other example embodiments of the inventive concept provide a method capable of fabricating an image sensor with an improved process yield.

According to example embodiments of the inventive concept, a method of fabricating an image sensor may include preparing a substrate with first, second and third pixel regions, coating a first color filter layer on the substrate, sequentially forming a first sacrificial layer and a first protection layer to cover the first color filter layer, forming a first photoresist pattern on the first protection layer to be overlapped with the first pixel region, performing a first dry etching process to the first sacrificial layer and the first protection layer to form a first color filter, a first sacrificial pattern, and a first protection pattern sequentially stacked on the first pixel region, the first photoresist pattern being used as an etch mask in the first dry etching process, and selectively removing the first sacrificial pattern to separate the first protection pattern from the first color filter.

In example embodiments, the selective removing of the first sacrificial pattern may be performed using a deionized water cleaning process.

In example embodiments, the first sacrificial layer may include a water-soluble polymer material.

In example embodiments, the first protection layer may include at least one of a silicon oxide layer, a silicon nitride layer, a silicon oxynitride layer, or a developable-bottom-anti-reflective coating (DBARC) layer.

In example embodiments, the first photoresist pattern may be etched in the first dry etching process to have a reduced thickness after the first dry etching process.

In example embodiments, the method may further include performing an ashing process to remove the first photoresist pattern, before the removing of the first sacrificial pattern.

In example embodiments, the first dry etching process may be performed such that portions of the first color filter layer remain on the second and third pixel regions, and the portions of the first color filter layer remaining on the second pixel region and the third pixel region may be removed during the ashing process.

In example embodiments, the method may further include forming a second color filter layer on the substrate provided with the first color filter, forming a second sacrificial layer and a second protection layer to cover the first and second color filter layers, forming a second photoresist pattern on the second protection layer to be overlapped with the first and second pixel regions, performing a second dry etching process to the second protection layer and the second sacrificial layer to form a second color filter on the second pixel region and a second sacrificial pattern and a second protection pattern covering the first and second color filters, the second photoresist pattern being used as an etch mask in the second dry etching process, selectively removing the second sacrificial pattern to separate the second protection pattern from the first and second color filters, forming a third color filter on the third pixel region, and forming a micro lens to cover the first, second and third color filters.

According to example embodiments of the inventive concept, an image sensor may include a substrate including first to third pixel regions, each of which includes a photoelectric conversion device formed therein, a first color filter and a first protection layer sequentially stacked on the first pixel region, a second color filter disposed on the second pixel region, a second protection layer covering the first protection pattern and the second color filter, a third color filter disposed on the third pixel region, and a micro lens covering the first to third color filters.

In example embodiments, the first and second protection layers may include the same material.

In example embodiments, the first and second protection layers may include a material having optical transmittance of about 99% or higher to visible light.

In example embodiments, the first and second protection layers may include at least one of a silicon oxide layer, a silicon nitride layer, or a silicon oxynitride layer.

In example embodiments, the second color filter may be thicker than the first color filter and the third color filter may be thicker than the second color filter.

In example embodiments, the second color filter may have a top surface coplanar with that of the first protection layer, and the third color filter may have a top surface coplanar with that of the second protection layer.

In example embodiments, the third color filter may have an upward convex top surface.

According to example embodiments of the inventive concept, a method of fabricating an image sensor may include providing a substrate comprising: first, second and third pixel regions; and a first color filter and a first protection layer sequentially stacked on the first pixel region. The method may further include: forming a second color filter on the second and third pixel regions to fill gap regions that are defined by the first color filter; forming a second protection layer to cover the second color filter and the first protection layer; forming a photoresist pattern on the second protection layer to cover the first and second pixel regions and to expose the third pixel region; performing a dry etching process on a portion of the second color filter exposed by the photoresist pattern to remove the second color filter and form gap regions on the third pixel region; and forming a third color filter to fill the gap regions on the third pixel region.

In example embodiments, the photoresist pattern may be etched in the dry etching process to have a reduced thickness after the dry etching process, and the method may further include performing an ashing process to remove the photoresist pattern before forming the third color filter.

In example embodiments, the method may further include forming a micro lens to cover the first, second and third color filters.

In example embodiments, the second color filter may be thicker than the first color filter and the third color filter may be thicker than the second color filter. In example embodiments, the second color filter may have a top surface that is coplanar with a top surface of the first protection pattern, and the third color filter may have a top surface that is coplanar with a top surface of the second protection layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
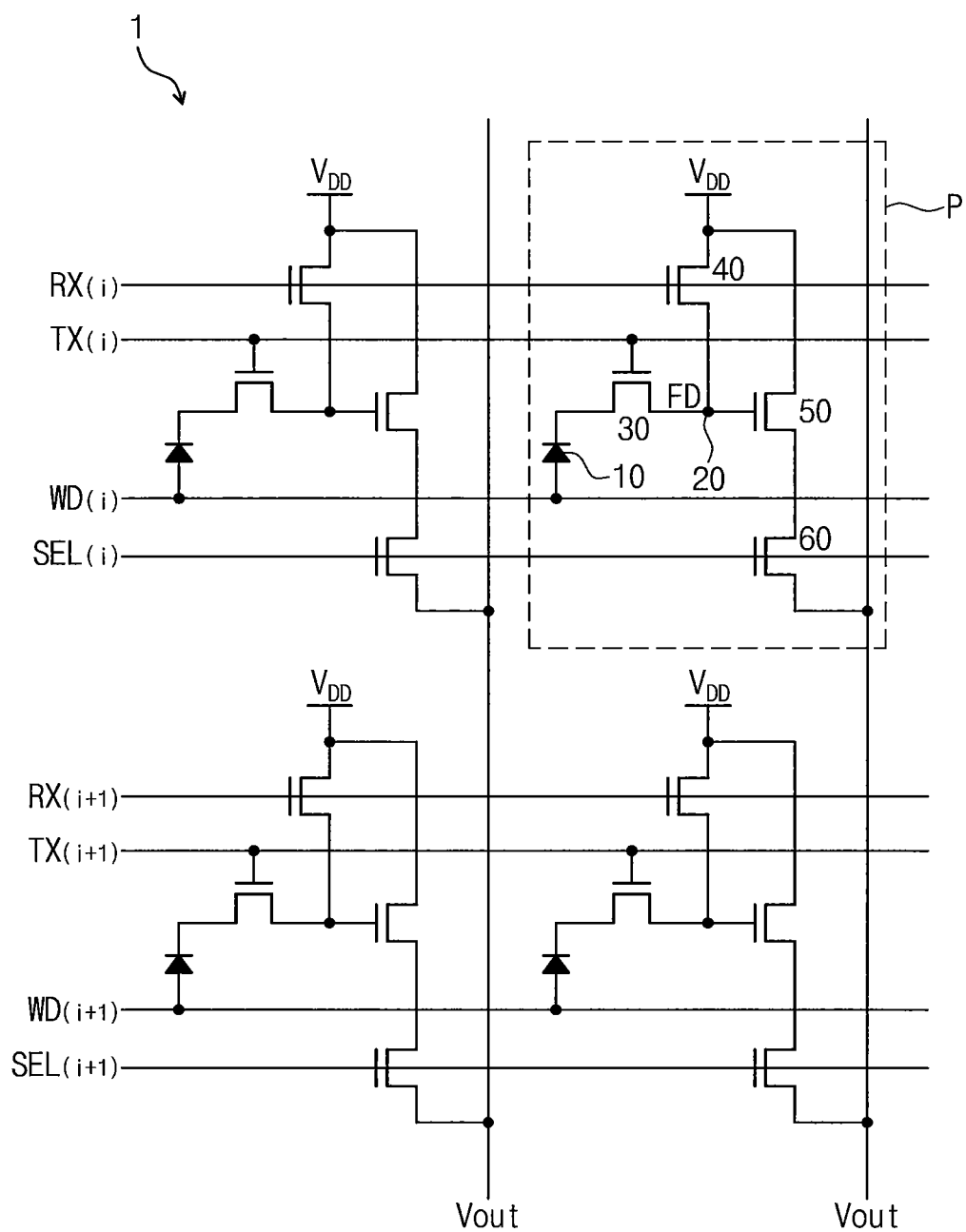
FIG. 1 is a circuit diagram illustrating an active pixel sensor (APS) array of an image sensor according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions may be exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a circuit diagram illustrating an active pixel sensor (APS) array of an image sensor according to example embodiments of the inventive concept.

Referring to FIG. 1, an active pixel sensor array 1 of an image sensor may include a plurality of unit pixels P, which may be arranged in the form of a matrix, and each of which converts optical signals to electric or electrical signals. Each of the unit pixels P may be configured to have one of a three transistor structure, a five transistor structure, a four transistor structure, and a photo gate structure. For the sake of simplicity, the description that follows will refer to an example of the present embodiment in which each unit pixel P is configured to include four N-type metal-oxide-semiconductor (NMOS) transistors.

Each of the unit pixels P may include a photoelectric conversion device 10 and a reading device. The photoelectric conversion device 10 may be configured to generate photocharges from incident light and store the photocharges, and the reading device may be configured to read out an electric signal generated from or stored in the photoelectric conversion device 10. The reading device may include a reset device 40, an amplifying device 50, and a selection device 60.

The photoelectric conversion device 10 may be configured to generate electric charges from incident light and store or accumulate them. The photoelectric conversion device 10 may include a photo diode, a photo transistor, a photo gate, a pinned photo diode (PPD), or any combination thereof. The photoelectric conversion device 10 may be connected to a charge transfer device 30 transferring the electric charges to a detection device 20.

The detection device 20 may be provided in the form of floating diffusion FD and receive electric charges from the photoelectric conversion device 10. The electric charges may be accumulated in the detection device 20. The detection device 20 may be electrically connected to the amplifying device 50 to control the amplifying device 50.

The reset device 40 may reset the detection device 20 periodically. A source of the reset device 40 may be connected to the detection device 20 and a drain of the reset device 40 may be connected to a power voltage $V_{DD}$. The reset device 40 may be operated by a bias voltage applied to a reset signal RX (i). For example, if the reset device 40 is turned on, the power voltage $V_{DD}$ may be transmitted to the detection device 20 through the reset device 40. In other words, a reset operation of the detection device 20 can be controlled by the reset device 40.

The amplifying device 50, in conjunction with a constant current source (not shown) provided outside the unit pixel P, may serve as a source-follower buffer amplifier amplifying a change in electric potential of the detection device 20 and output the amplified signal to an output line $V_{out}$.

The selection device 60 may select a row of unit pixels. The selection device 60 may be operated by a bias applied to a row selection line SEL (i), and if the selection device 60 is turned on, the power voltage may be transmitted to a drain of the selection device 60 through the amplifying device 50.

Further, signal lines TX (i), RX (i), and SEL (i) for driving the charge transfer device 30, the reset device 40, and the selection device 60 may extend along a row or horizontal direction and thereby operate simultaneously a plurality of unit pixels constituting the same row.

Figure 2:
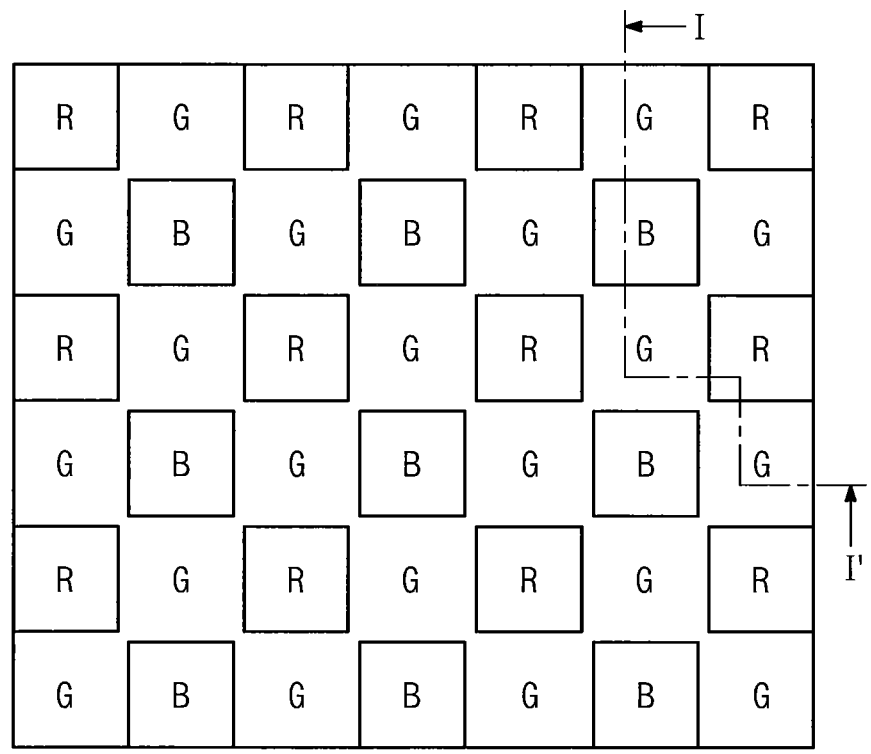
FIG. 2 is a plan view illustrating an image sensor according to example embodiments of the inventive concept.
Figure 3:
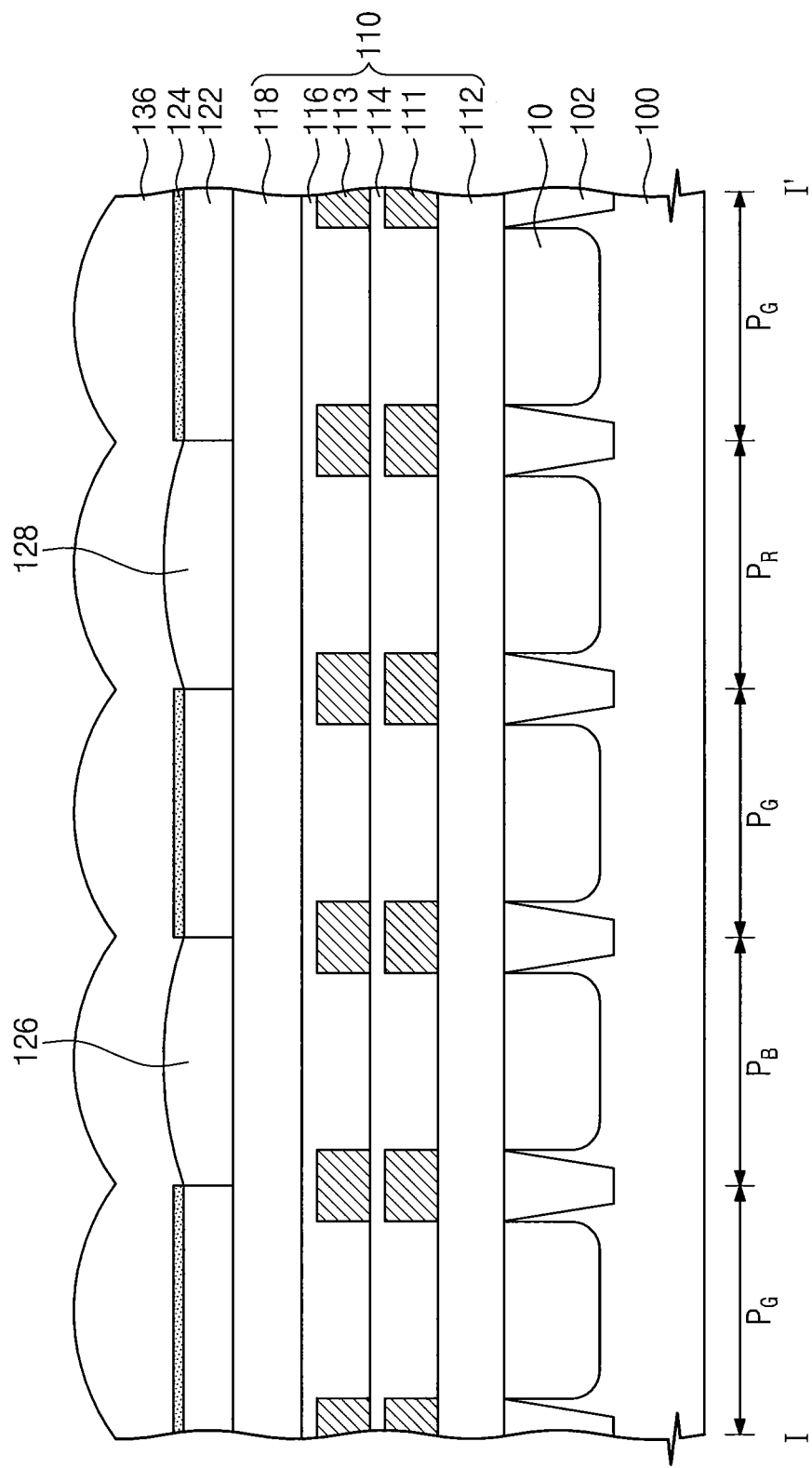
FIG. 3 is a sectional view taken along line I-I' of FIG. 2 to illustrate an image sensor according to example embodiments of the inventive concept.

FIG. 2 is a plan view illustrating an image sensor according to example embodiments of the inventive concept, and FIG. 3 is a sectional view taken along line I-I' of FIG. 2 to illustrate an image sensor according to example embodiments of the inventive concept.

Referring to FIGS. 2 and 3, a device isolation layer 102 may be provided on a substrate 100 to delimit unit pixel regions $P_G$, $P_B$, and $P_R$. The unit pixel regions $P_G$, $P_B$, and $P_R$ may include a green pixel region $P_G$, a blue pixel region $P_B$, and a red pixel region $P_R$. The photoelectric conversion device 10 may be formed on each of the unit pixel regions $P_G$, $P_B$, and $P_R$ of the substrate 100. The photoelectric conversion device 10 may be or include one of a photo diode, a pinned photo diode, a photo gate, or a photo transistor. The photoelectric conversion device 10 may be an n-type impurity region, which is formed by doping n-type impurities into the substrate 100. Although not shown, the photoelectric conversion device 10 may further include a p-type impurity region, which is thinly formed in the n-type impurity region and adjacent to a top surface of the substrate 100, in addition to the n-type impurity region. In certain embodiments, the photoelectric conversion device 10 may be provided in the form of a pinned photo diode.

A plurality of transistors (not shown) may be integrated on the substrate 100. For example, a charge-transfer device, a reset device, an amplifying device, and a selection device may be provided on each of the unit pixel regions $P_G$, $P_B$, and $P_R$.

An interlayered insulating structure 110 may be disposed on the substrate 100. The interlayered insulating structure 110 may include a plurality of interlayered insulating layers 112, 114, 116, and 118 and a plurality of wires 111 and 113. The wires 111 and 113 may be disposed in such a way that they are not aligned with or overlapped with the unit pixel regions $P_G$, $P_B$, and $P_R$. Each of the wires 111 and 113 may be connected to the transistors or another of the wires 111 and 113 through via contacts or via plugs (not shown). The arrangement of the wires 111 and 113 may be modified in various ways as understood by one skilled in the art.

Color filters 122, 126, and 128 may be provided on the interlayered insulating structure 110. The color filters 122, 126, and 128 may include a first color filter 122, a second color filter 126, and a third color filter 128. In certain embodiments, the first, second, and third color filters 122, 126, and 128 may be provided to be aligned with or to face the green, blue, and red pixel regions $P_G$, $P_B$, and $P_R$, respectively. For example, the first, second, and third color filters 122, 126, and 128 may be green, blue, and red filters, respectively. In the case where light is incident into the color filters 122, 126, and 128 from the outside, each of the color filters 122, 126, and 128 may be configured in such a way that a fraction of the incident light, whose wavelength is in a wavelength range of the corresponding color, is incident into a corresponding one of the green, blue, and red pixel regions $P_G$, $P_B$, and $P_R$.

The first to third color filters 122, 126, and 128 may be arranged on the interlayered insulating structure 110 to form a Bayer-type arrangement. In the Bayer-type arrangement, the green filters, to which human eye is most sensitive, may be provided to occupy half of the color filters.

The first color filter 122 may have a flat top surface. A first protection pattern 124 may be provided on the first color filter 122. In certain embodiments, the first protection pattern 124 may include a material, whose optical transmittance to visible light (of about 400-800 nm) is about 99% or higher. The first protection pattern 124, for example, may include at least one of silicon oxide, silicon nitride, or silicon oxynitride. The first protection pattern 124 may have a thickness of about 500 Å or less.

Each of the second and third color filters 126 and 128 may be provided to have an outward or upward convex top surface. For example, the second and third color filters 126 and 128 may protrude outward or upward from the first color filter 122.

A micro lens 136 may be provided on the interlayered insulating structure 110 to cover the first to third color filters 122, 126, and 128. In certain embodiments, a top surface of the micro lens 136 may have outward or upward convex portions formed on the first to third color filters 122, 126, and 128, respectively.

Figure 4:
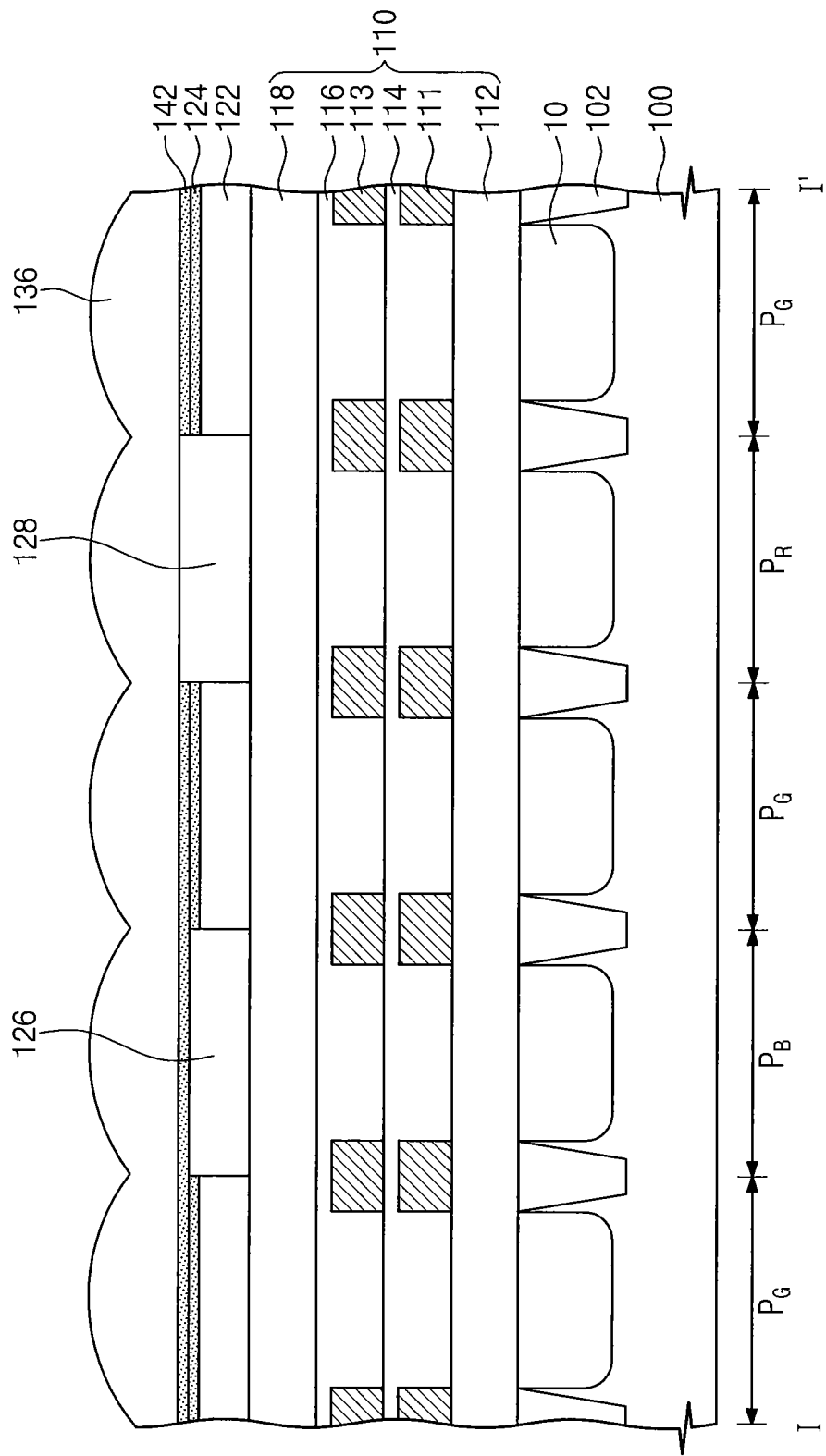
FIG. 4 is a sectional view taken along line I-I' of FIG. 2 to illustrate an image sensor according to other example embodiments of the inventive concept.

FIG. 4 is a sectional view taken along line I-I' of FIG. 2 to illustrate an image sensor according to other example embodiments of the inventive concept. In the following description of FIG. 4, for the sake of brevity, a previously described element may be identified by a similar or identical reference number without repeating the description thereof.

Referring to FIG. 4, the second color filter 126 may be formed to have a top surface coplanar with that of the first protection pattern 124. In other words, the second color filter 126 may be thicker than the first color filter 122.

A second protection layer 142 may be disposed on the second color filter 126. The second protection layer 142 may cover the top surfaces of the first protection pattern 124 and the second color filter 126. The second protection layer 142 may be formed of the same material as the first protection pattern 124. The second protection layer 142 may have a thickness of about 500 Å or less.

The third color filter 128 may be formed to have a top surface coplanar with that of the second protection layer 142. In other words, the third color filter 128 may be thicker than the second color filter 126.

Although not illustrated in the drawings, the top surface of the third color filter 128 may have an outward or upward convex profile.

The micro lens 136 may be formed to cover the top surfaces of the second protection layer 142 and the third color filter 128.

Figure 5:
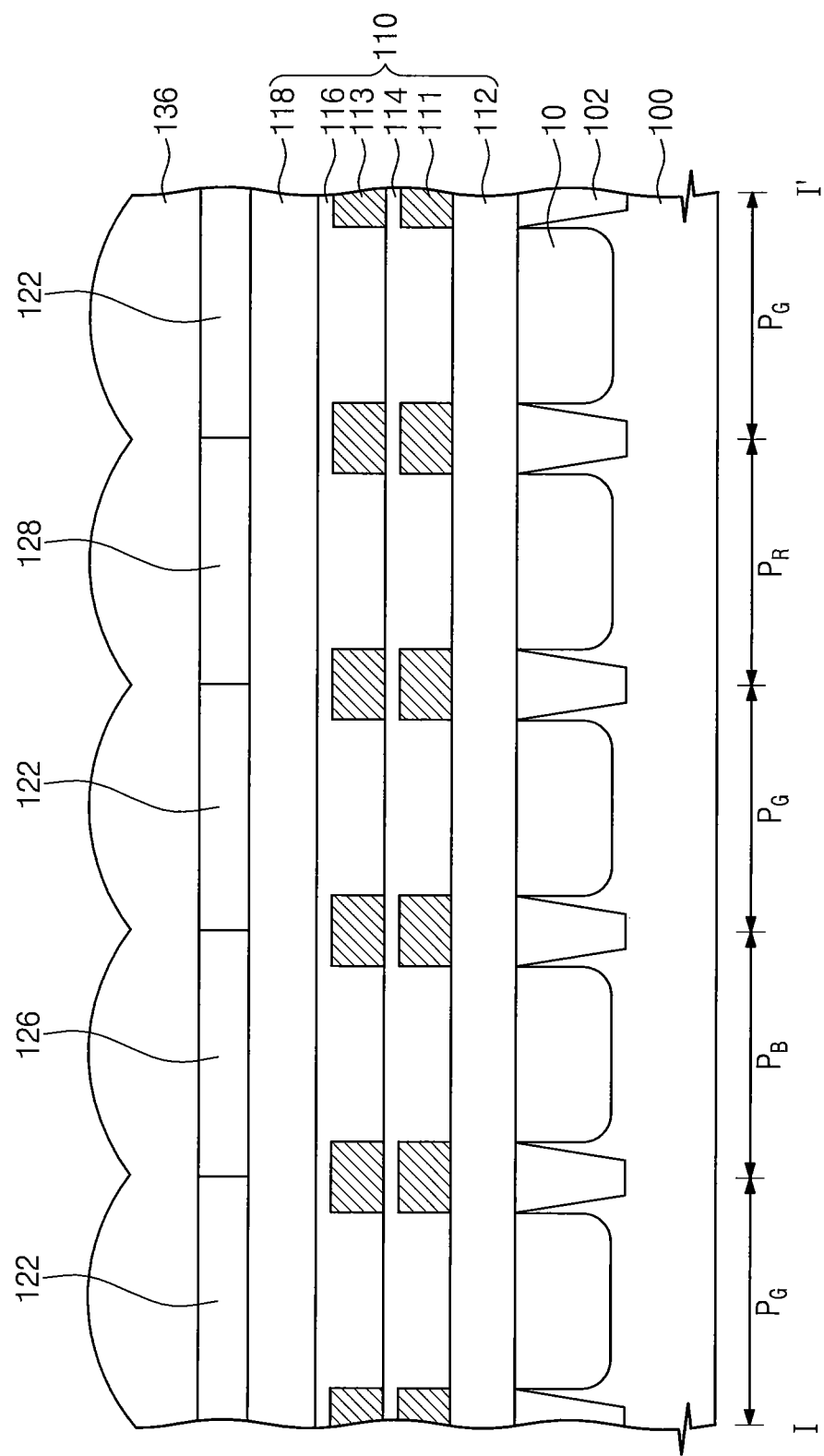
FIG. 5 is a sectional view taken along line I-I' of FIG. 2 to illustrate an image sensor according to still other example embodiments of the inventive concept.

FIG. 5 is a sectional view taken along line I-I' of FIG. 2 to illustrate an image sensor according to still other example embodiments of the inventive concept. In the following description of FIG. 5, for the sake of brevity, a previously described element may be identified by a similar or identical reference number without repeating the description thereof.

Referring to FIG. 5, the first to third color filters 122, 126, and 128 may have the same thickness. For example, the first to third color filters 122, 126, and 128 may be formed to have top surfaces coplanar with each other. The micro lens 136 may be formed to cover the top surfaces of the first to third color filters 122, 126, and 128.

FIGS. 7, 11, 14, and 17 are plan views illustrating a method of fabricating an image sensor, according to example embodiments of the inventive concept. FIGS. 6, 8, 9, 10, 12, 13, 15, 16, 18, and 19 are sectional views taken along line I-I' of FIGS. 7, 11, 14, and 17 to illustrate the method of fabricating an image sensor, according to example embodiments of the inventive concept.

Figure 6:
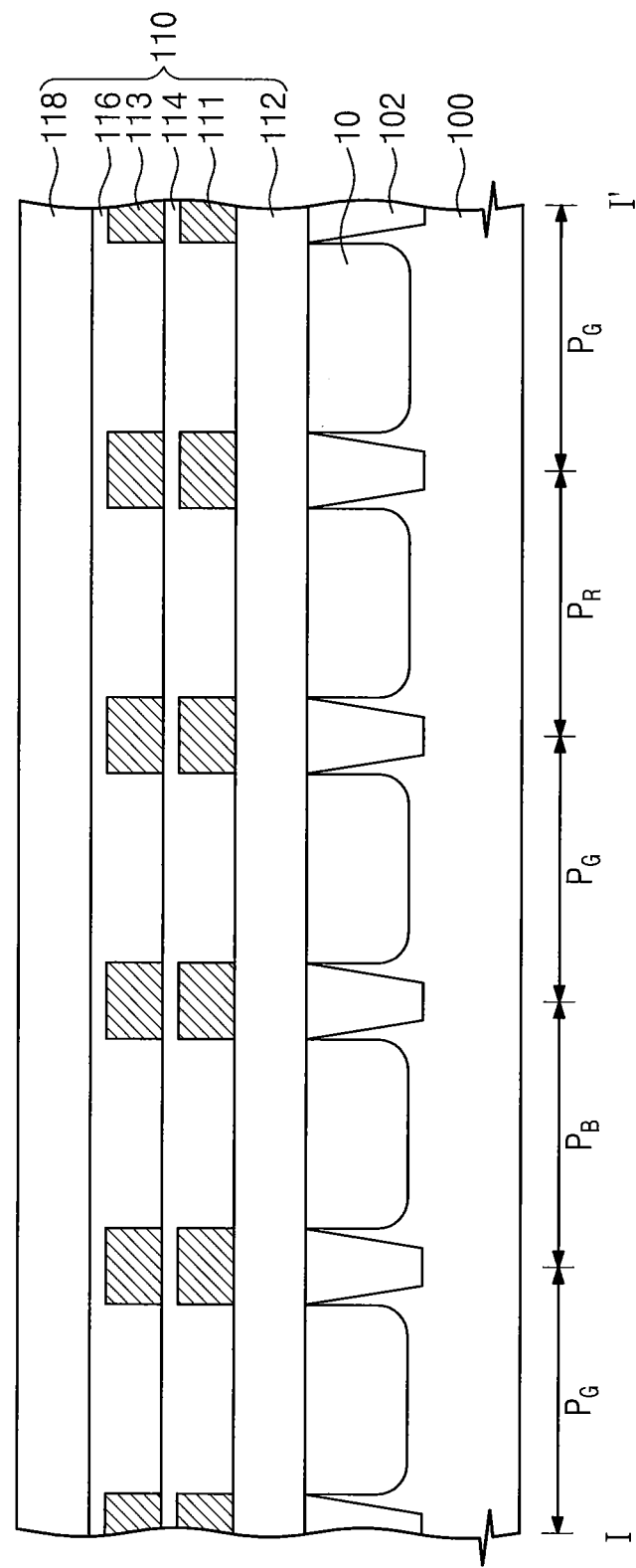
FIGS. 6, 8, 9, 10, 12, 13, 15, 16, 18, and 19 are sectional views taken along line I-I' of FIGS. 7, 11, 14, and 17 to illustrate the method of fabricating an image sensor, according to example embodiments of the inventive concept.

Referring to FIG. 6, a device isolation layer 102 may be formed on or in a substrate 100. In certain embodiments, the device isolation layer 102 may be formed by a local-oxidation-of-silicon (LOCOS) process or a shallow-trench isolation (STI) process. As the result of the formation of the device isolation layer 102, active regions including unit pixel regions $P_G$, $P_B$, and $P_R$ may be defined in the substrate 100.

Photoelectric conversion devices 10 may be provided in the active region. The photoelectric conversion device 10 may be an n-type impurity region, which is formed by doping n-type impurities into the substrate 100, for example, using an ion implantation process. The formation of the photoelectric conversion device 10 may further include forming a p-type impurity region in the n-type impurity region adjacent to the top surface of the substrate 100. In certain embodiments, the p-type impurity region may be formed using an ion implantation process, and in this case, the photoelectric conversion device 10 may have a pinned photodiode structure.

An interlayered insulating structure 110 may be formed on the substrate 100. The interlayered insulating structure 110 may include a plurality of interlayered insulating layers 112, 114, 116, and 118 and a plurality of wires 111 and 113 provided therein. The interlayered insulating layers 112, 114, 116, and 118 may be formed of or include, for example, at least one of high density plasma (HDP) oxide, TEOS oxide, Tonen SilaZene (TOSZ), spin-on-glass (SOG), undoped silica glass (USG) or high-k dielectric. At least one etch stop layer (not shown) may be additionally formed between the interlayered insulating layers 112, 114, 116, and 118. The etch stop layer may be formed of or include a silicon nitride layer and/or a silicon oxynitride layer.

The formation of the wires 111 and 113 may include depositing a conductive layer on the interlayered insulating layers 112, 114, 116, and 118 and then patterning the conductive layer. The wires 111 and 113 may be formed of a metallic material (e.g., of copper, tungsten, titanium, tantalum, or aluminum). The wires 111 and 113 may be formed not to be aligned or overlapped with the photoelectric conversion devices 10 formed in the unit pixel regions $P_G$, $P_B$, and $P_R$. Although not illustrated in the drawings, contact or via plugs (not shown) may be formed between or through the interlayered insulating layers 112, 114, 116, and 118 to connect the wires 111 and 113 to each other or another device.

Figure 7:
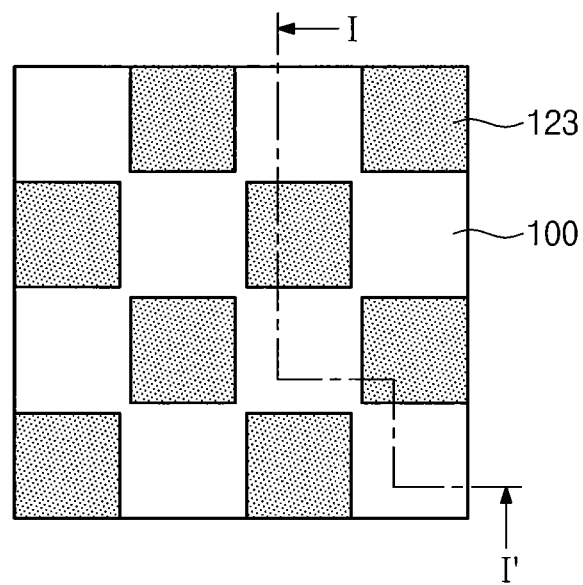
FIGS. 7, 11, 14, and 17 are plan views illustrating a method of fabricating an image sensor, according to example embodiments of the inventive concept.
Figure 8:
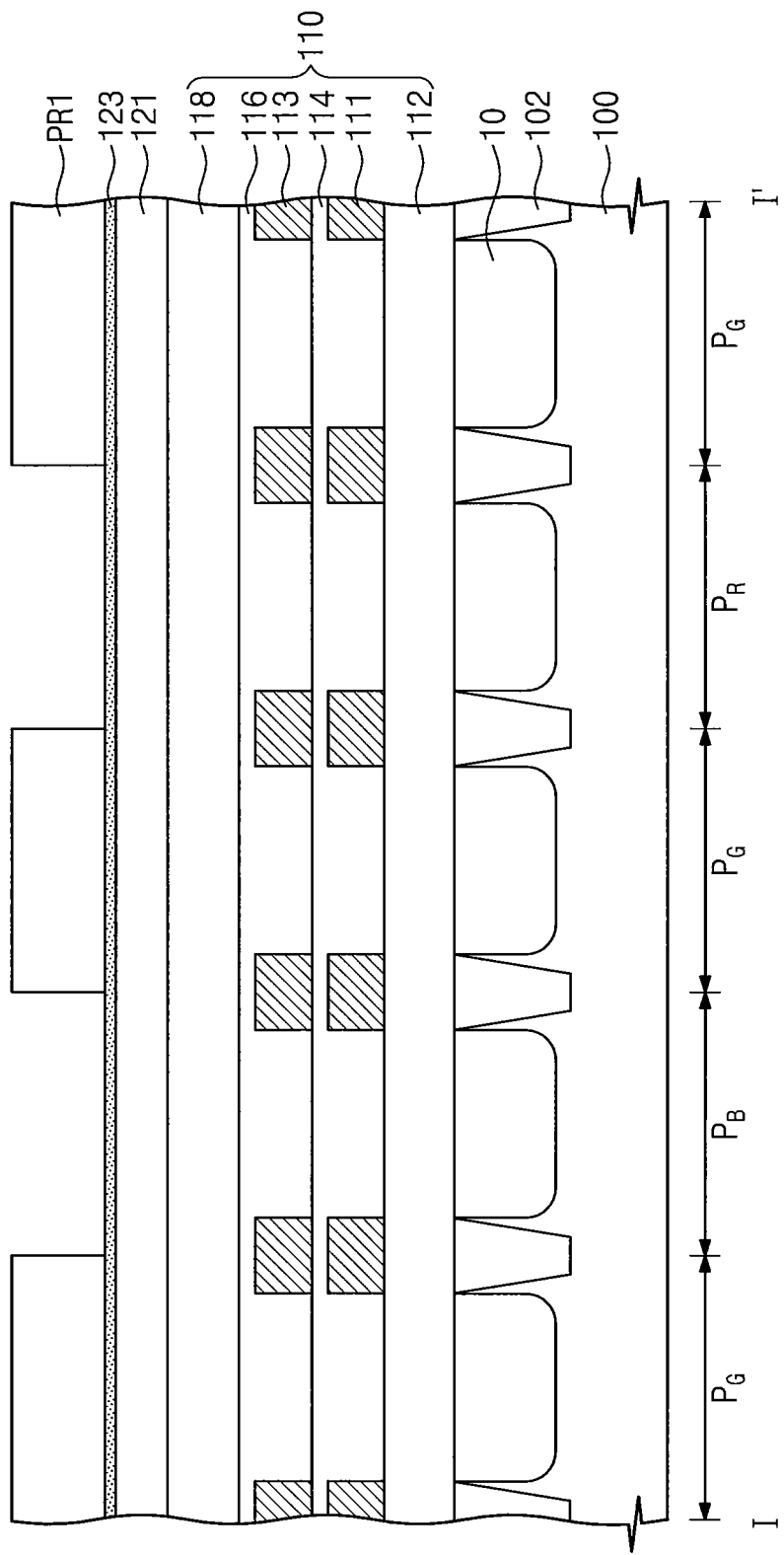

Referring to FIGS. 7 and 8, a first color filter layer 121 may be formed on the interlayered insulating structure 110. In certain embodiments, the first color filter layer 121 may be a photoresist layer containing green pigment. The first color filter layer 121 may be formed by a spin coating method.

A first protection layer 123 may be formed on the first color filter layer 121. The first protection layer 123 may be formed of a material having optical transmittance of about 99% or higher to visible light (of about 400-800 nm). For example, the first protection layer 123 may be formed of or include at least one of a silicon oxide layer, a silicon nitride layer, or a silicon oxynitride layer. The first protection layer 123 may be formed to have a thickness of about 500 Å or less.

A first photoresist pattern PR1 may be formed on the first protection layer 123. The first photoresist pattern PR1 may be formed to cover the green pixel regions $P_G$ and expose the blue and red pixel regions $P_B$ and $P_R$.

Figure 9:
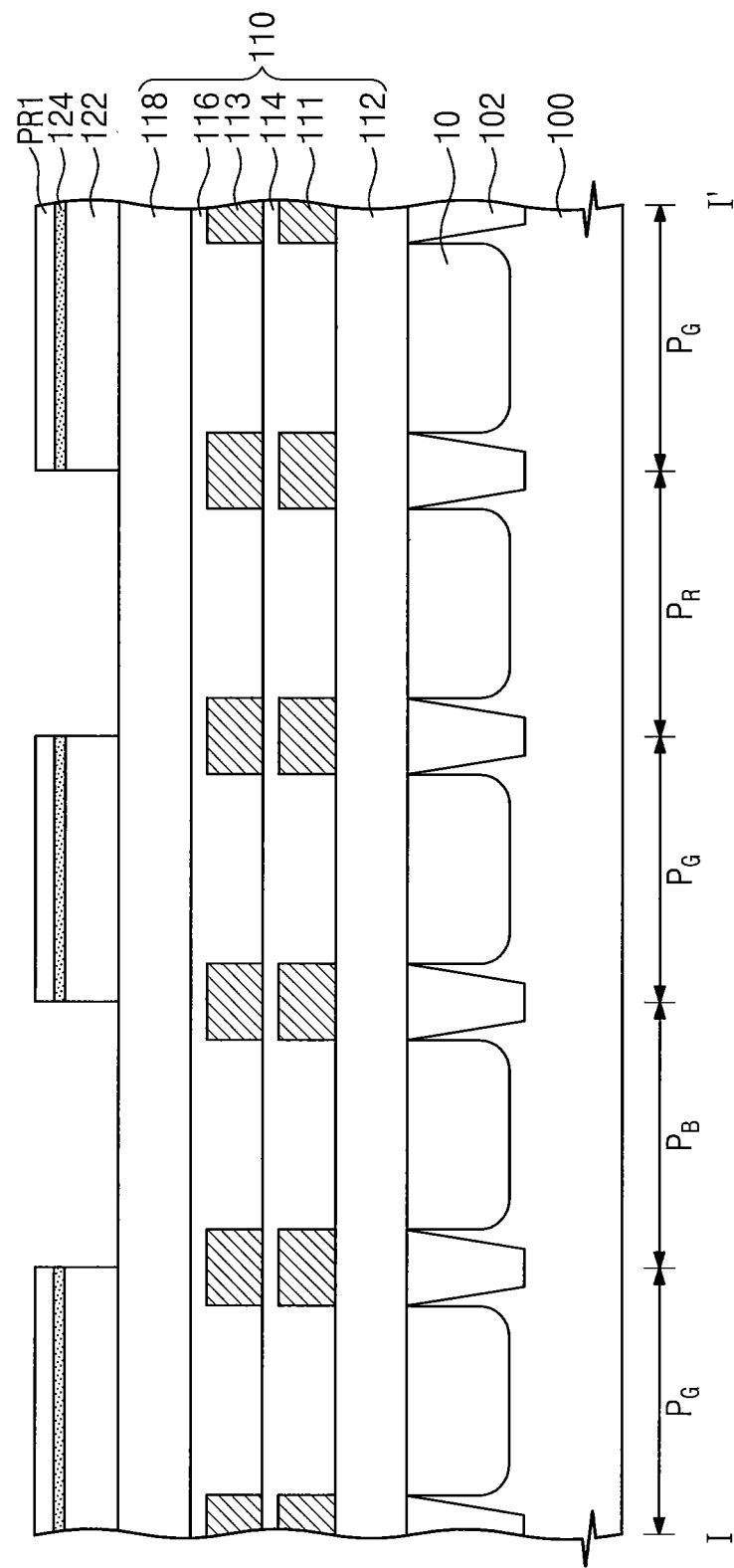

Referring to FIG. 9, the first color filter layer 121 may be patterned. For example, the first protection layer 123 and the first color filter layer 121 may be sequentially etched by a dry etching process, in which the first photoresist pattern PR1 is used as an etch mask. Accordingly, a first color filter 122 and a first protection pattern 124 may be formed on the green pixel region $P_G$, and the first color filter layer 121 and the first protection layer 123 may be removed over the blue pixel region $P_B$ and the red pixel region $P_R$ to expose a top surface of the uppermost layer (e.g., the insulating layer 118) of the interlayered insulating structure 110. In certain embodiments, after the etching process, the first photoresist pattern PR1 may remain on the first protection pattern 124, as shown in FIG. 9.

Figure 10:
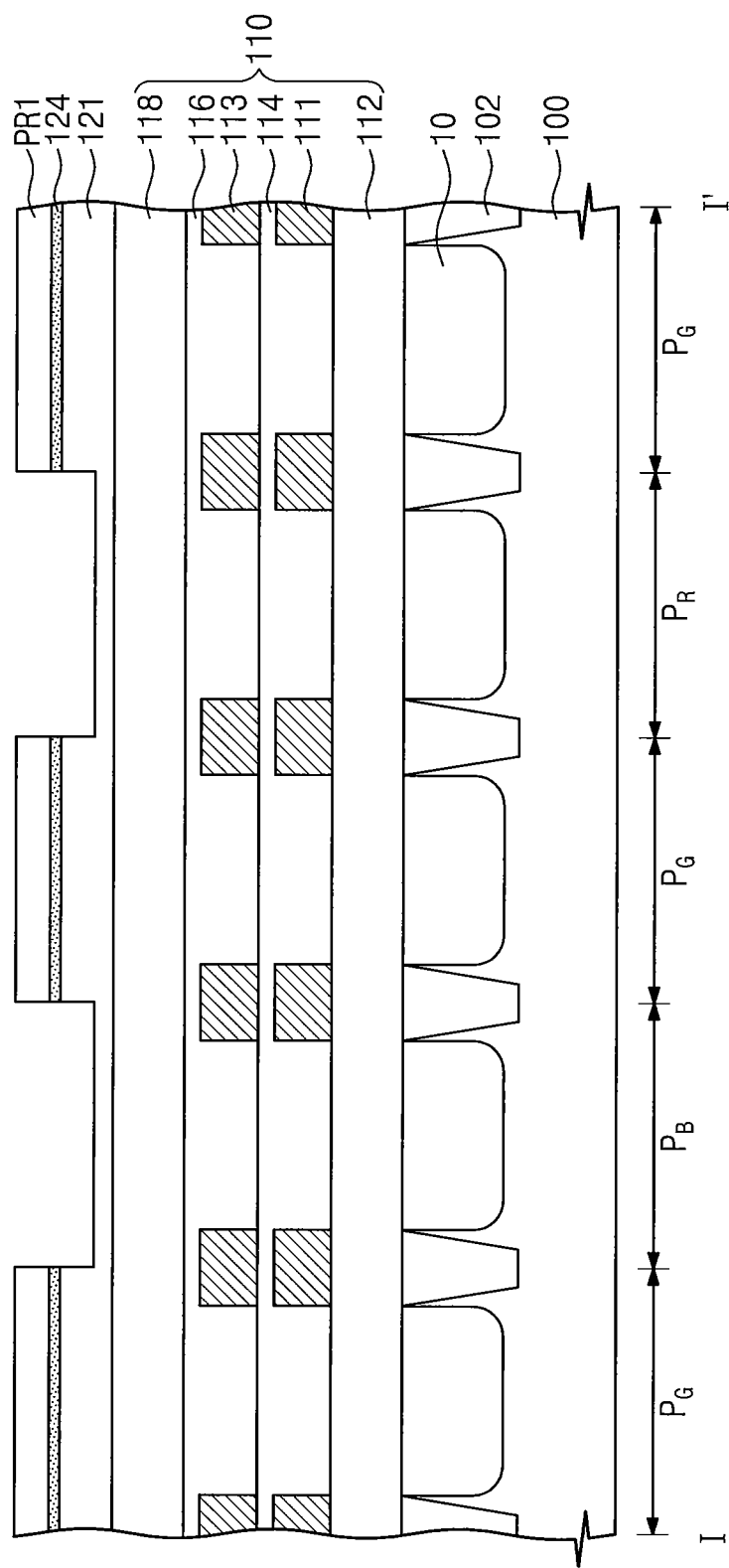

In other embodiments, as shown in FIG. 10, the first color filter layer 121 may be etched in such a way that a portion thereof remains over the blue pixel region $P_B$ and the red pixel region $P_R$. In other words, the etching of the first color filter layer 121 may be performed to form recessed regions, whose bottoms are spaced apart from the interlayered insulating structure 110, over the blue and red pixel regions $P_B$ and $P_R$.

Figure 11:
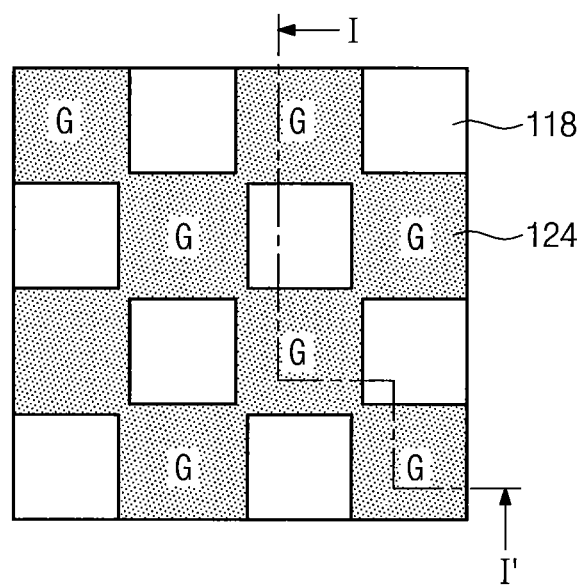
Figure 12:
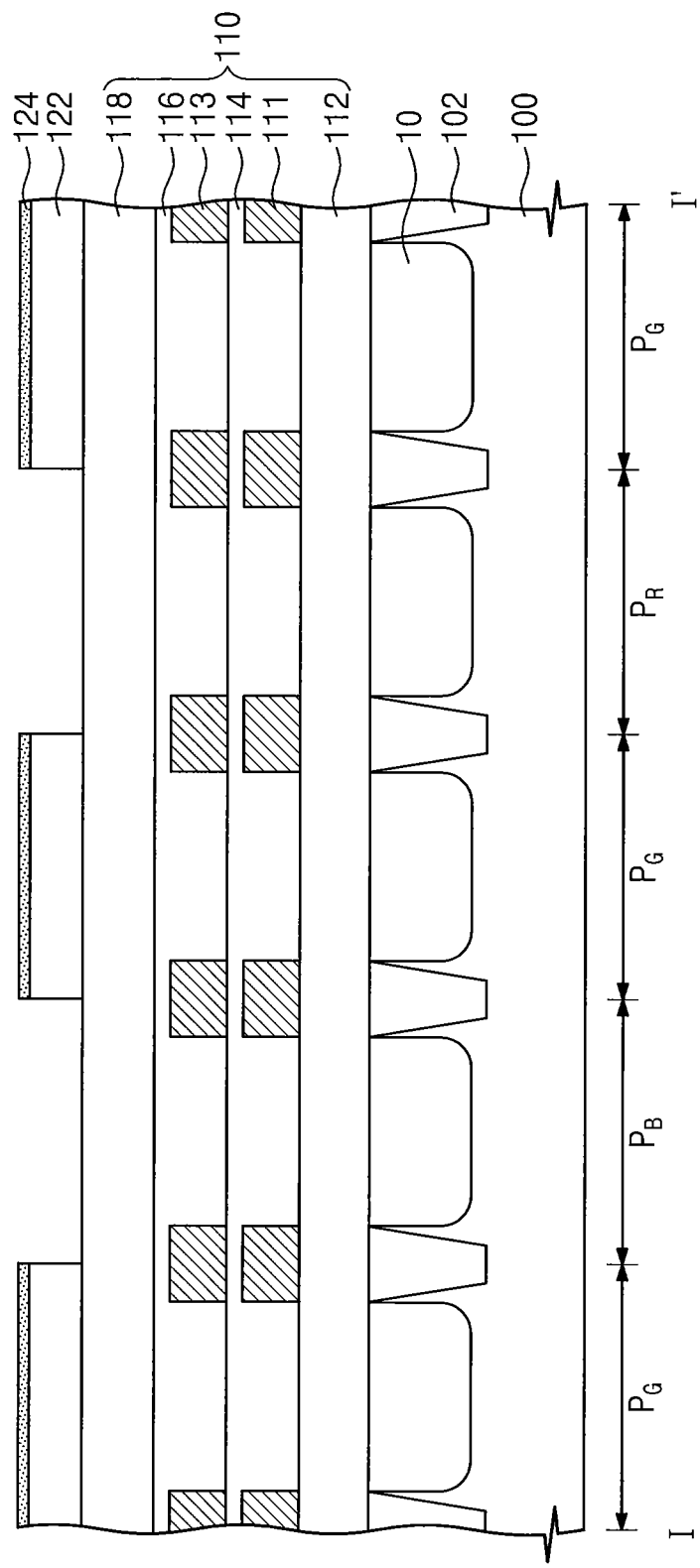

Referring to FIGS. 11 and 12, the first photoresist pattern PR1 may be completely or wholly removed from a top surface of the first protection layer 124. The removal of the first photoresist pattern PR1 may be performed by an ashing process. In addition, the remaining portions of the first color filter layer 121 over the blue and red pixel regions $P_B$ and $P_R$ may be removed during the removal of the first photoresist pattern PR1. As a result, the first color filter 122 may be formed on the green pixel region $P_G$. In certain embodiments, the first color filter 122 may be a green filter.

Figure 13:
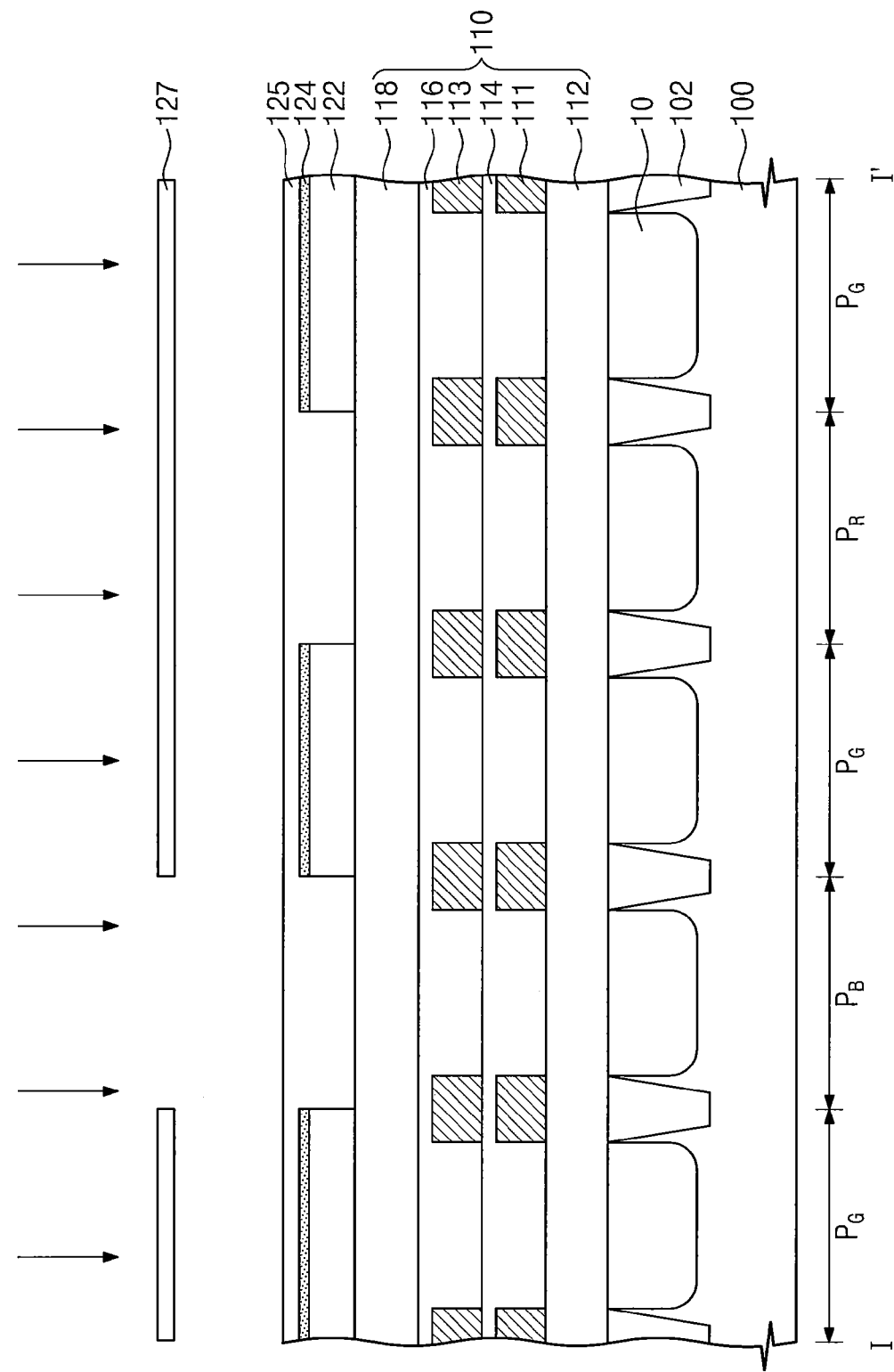

Referring to FIG. 13, a second color filter layer 125 may be formed on the interlayered insulating structure 110 with the first color filter 122. The second color filter layer 125 may be formed to completely or wholly cover the first protection pattern 124 and completely or wholly fill gap regions between the first color filters 122. In certain embodiments, the second color filter layer 125 may be a photoresist layer containing blue pigment. The second color filter layer 125 may be formed by a spin coating method. The second color filter layer 125 may be, for example, a negative photoresist layer.

A first photo mask 127 may be formed on the second color filter layer 125. The first photo mask 127 may be formed to expose the blue pixel region $P_B$. Thereafter, an exposure process using the first photo mask 127 may be performed to cure the second color filter layer 125 formed on the blue pixel region $P_B$.

Figure 14:
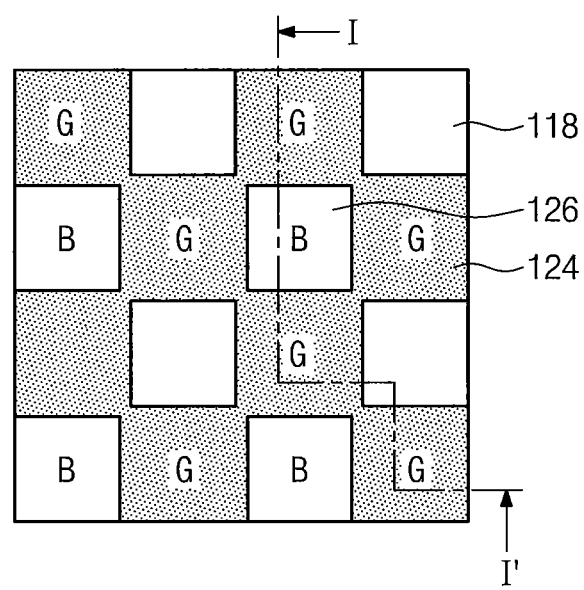
Figure 15:
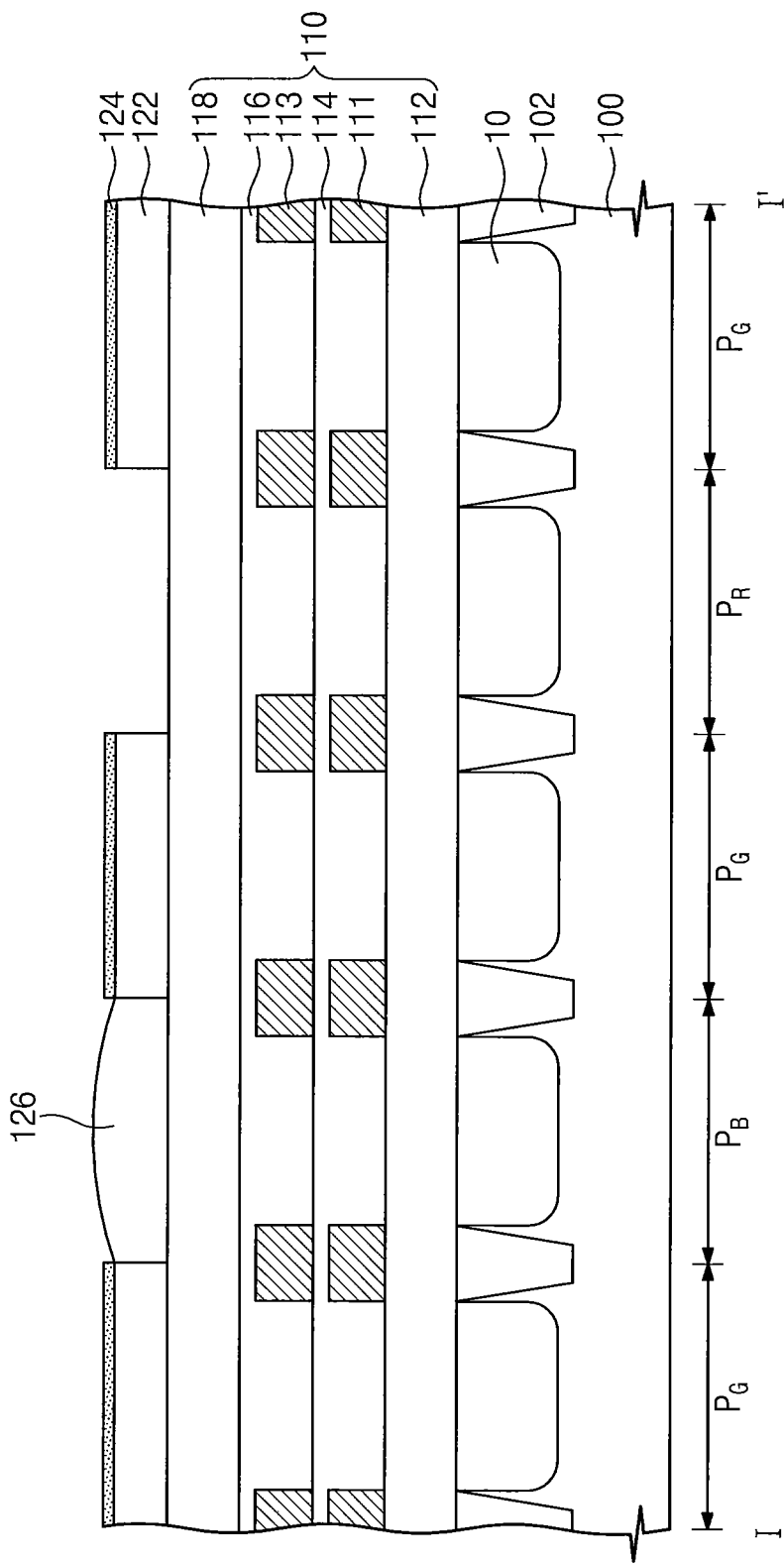

Referring to FIGS. 14 and 15, a development process may be performed to remove the second color filter layer 125 from the green and red pixel regions $P_G$ and $P_R$ but not the blue pixel region $P_B$. Accordingly, a second color filter 126 may be formed on the blue pixel region $P_B$. In certain embodiments, the second color filter 126 may be a blue filter.

Figure 16:
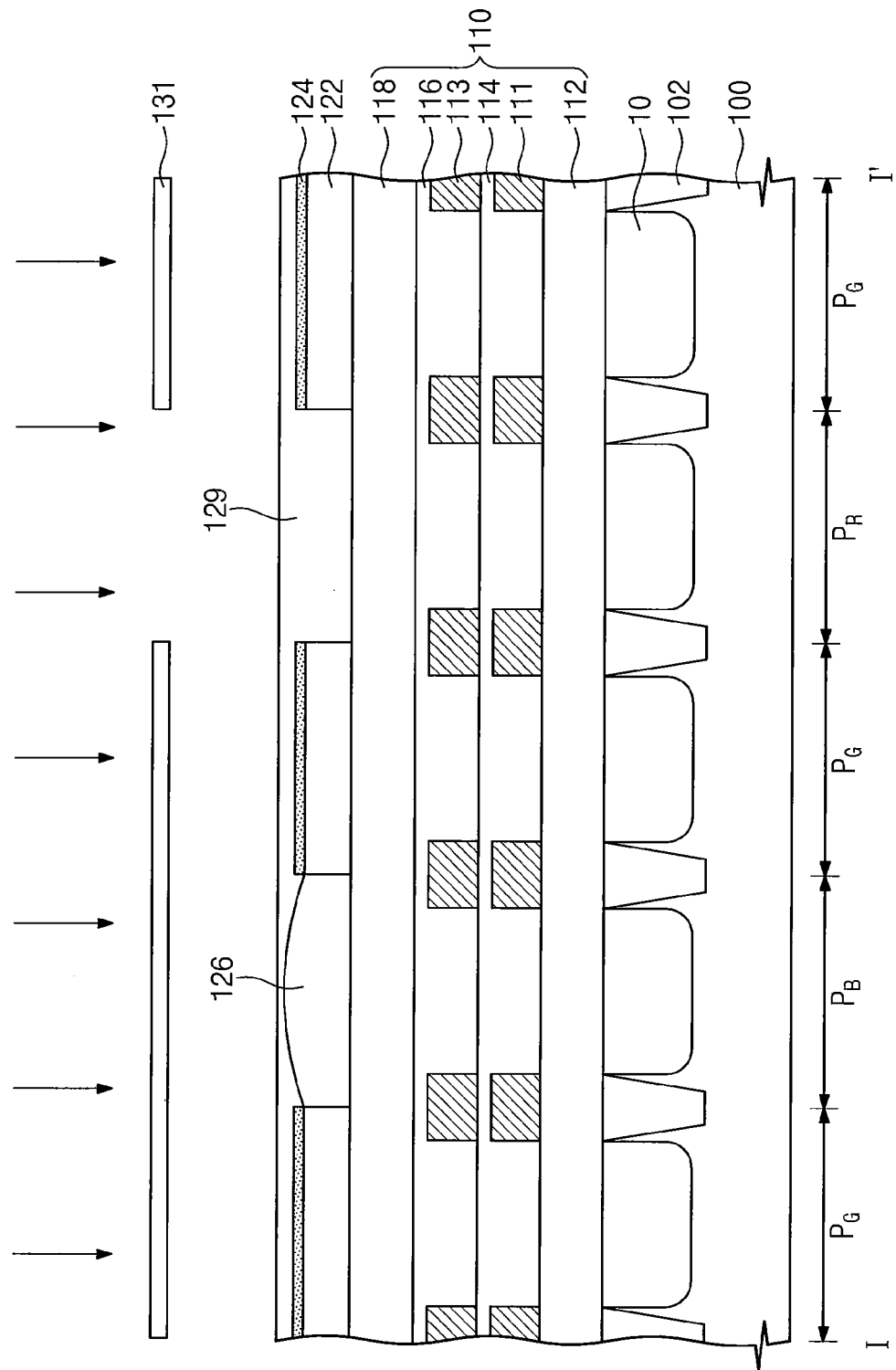

Referring to FIG. 16, a third color filter layer 129 may be formed on the interlayered insulating structure 110 provided with the first and second color filters 122 and 126. The third color filter layer 129 may be formed to completely or wholly cover the first protection pattern 124 and the second color filter 126 and completely or wholly fill gap regions between the first color filters 122. In certain embodiments, the third color filter layer 129 may be a photoresist layer containing red pigment. The third color filter layer 129 may be formed by the same method and of the same material as at least one of the first and second color filter layers 121 and 125.

A second photo mask 131 may be formed on the third color filter layer 129. The second photo mask 131 may be formed to expose the red pixel region $P_R$, and then an exposure process using the second photo mask 131 may be performed to cure the third color filter layer 129 formed on the red pixel region $P_R$.

Figure 17:
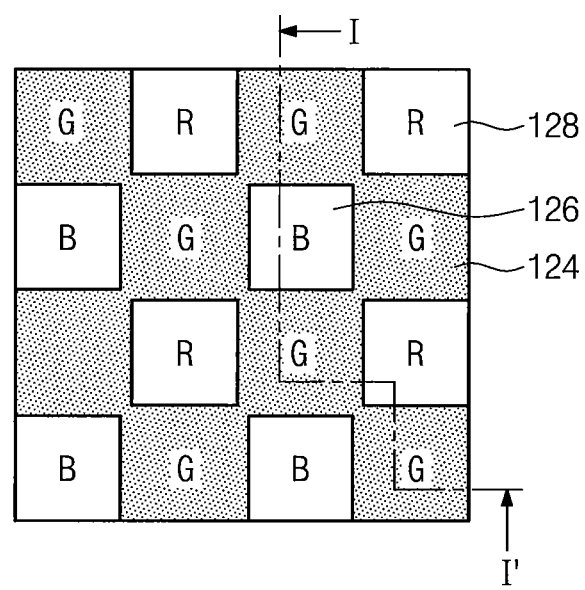
Figure 18:
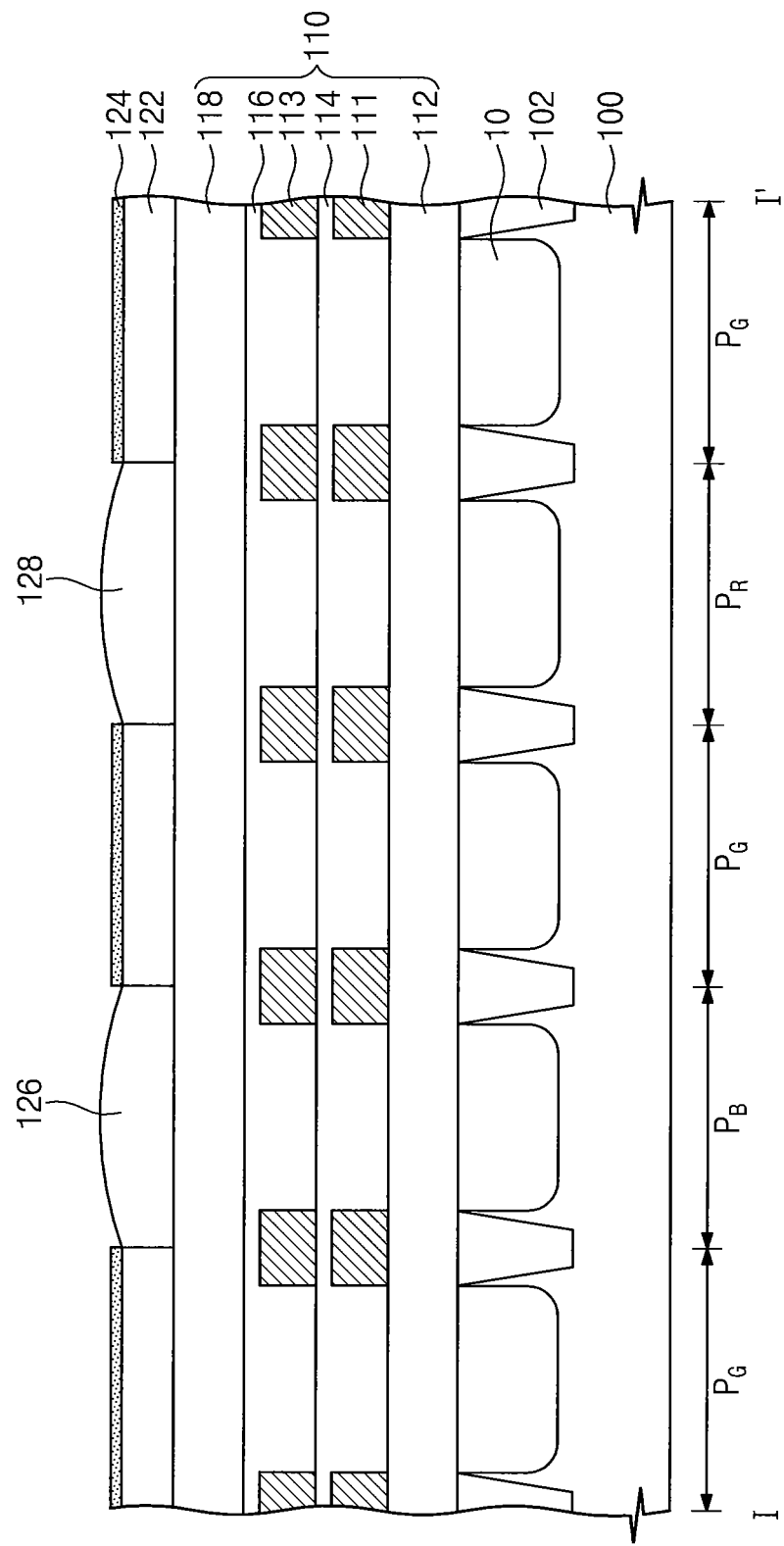

Referring to FIGS. 17 and 18, a development process may be performed to remove the third color filter layer 129 from the green and blue pixel regions $P_G$ and $P_B$ but not the red pixel region $P_R$. Accordingly, a third color filter 128 may be formed on the red pixel region $P_R$. The third color filter 128 may be a red filter.

Figure 19:
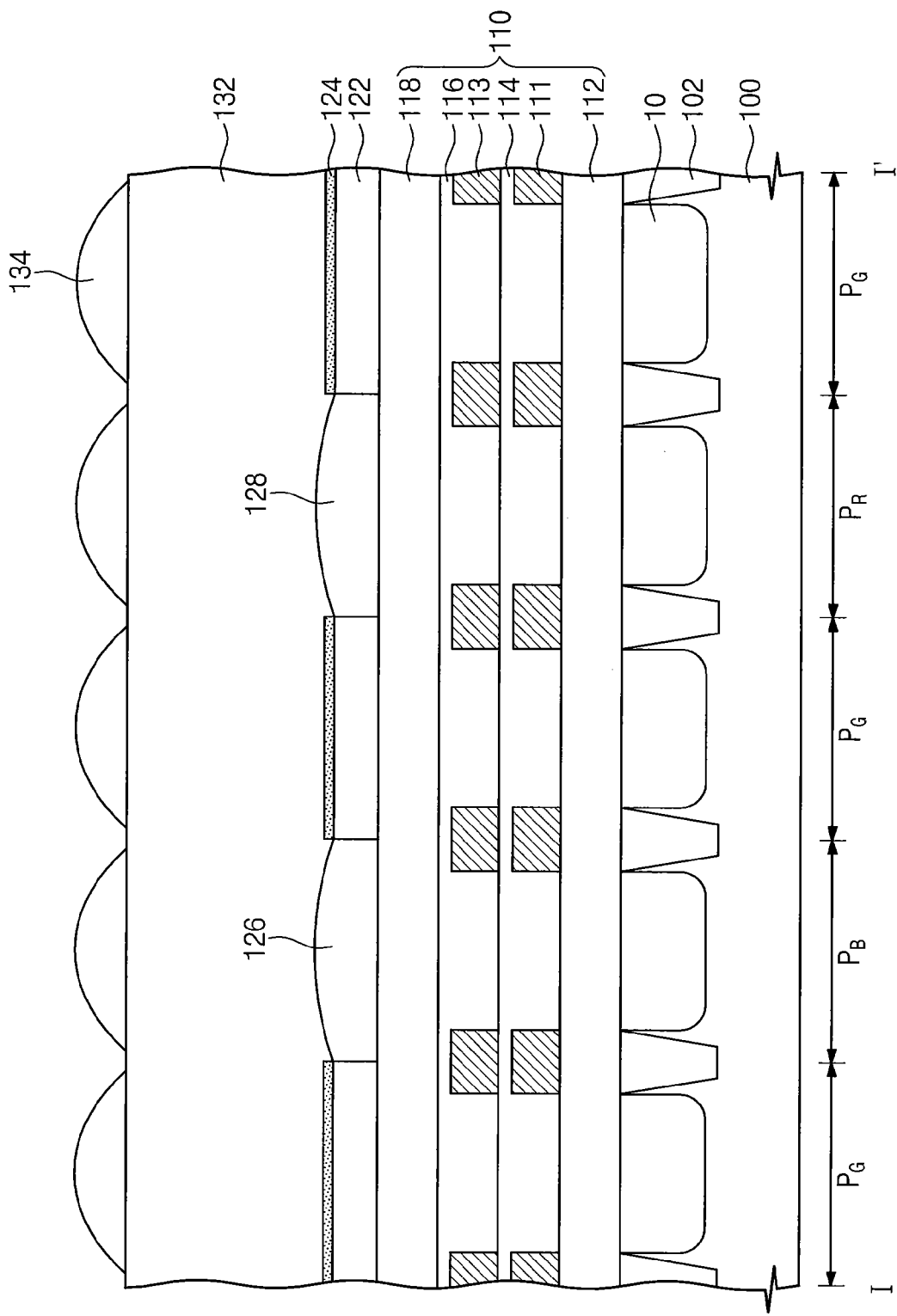

Referring to FIG. 19, a light-transmission type photoresist layer 132 may be formed on the first, second and third color filters 122, 126, and 128, and then mask patterns 134 may be formed on the light-transmission type photoresist layer 132. The mask patterns 134 may be formed to have an outward or upward convex top surface with a specific curvature. The mask patterns 134 may be spaced apart from each other to face the unit pixel regions $P_G$, $P_B$, and $P_R$, respectively. The mask pattern 134 may be formed of a photoresist material.

Referring back to FIG. 3, the light-transmission type photoresist layer 132 may be patterned to form a micro lens 136. The formation of the micro lens 136 may include etching the light-transmission type photoresist layer 132 using the mask pattern 134 as an etch mask, and the etching process may be performed until the mask pattern 134 is completely or wholly removed. In certain embodiments, the mask pattern 134 may also be etched in the process of etching the light-transmission type photoresist layer 132, and thus, the convex profile of the mask patterns 134 may be copied or transcribed to the light-transmission type photoresist layer 132. For example, the etched top surface of the light-transmission type photoresist layer 132 may have the same profile as that of the mask patterns 134. The micro lens 136 may be formed to cover uneven top surfaces of the first to third color filters 122, 126, and 128. Furthermore, the micro lens 136 may be formed in such a way that portions positioned over the photoelectric conversion devices 10 can have a convex profile.

As a size of each pixel of an image sensor decreases, it is desirable to form color filters having a reduced width (e.g., of 1 μm or less). A dry etching process may be used to realize such a narrow width of the color filters. The formation of the color filter may include forming a color photoresist layer containing pigment, forming a photoresist pattern on the color photoresist, and then patterning the color photoresist using the photoresist pattern as an etch mask. Since both of the color filter and the photoresist pattern are photoresist-based materials, a portion of the photoresist pattern may remain on the color filter when the photoresist pattern is removed. This may result in a stain failure or staining of the image sensor. Further, even when the photoresist pattern is selectively removed, the color filter may be deformed, and this may also result in the stain failure or staining of the image sensor.

By contrast, according to example embodiments of the inventive concept, the first protection layer 124 is formed on the first color filter layer 121. The first protection layer 124 may protect the top surface of the first color filter 122 when the first photoresist pattern PR1 is removed, and thus, it is possible to prevent the first color filter 122 from being deformed. In other words, it is possible to selectively remove the first photoresist pattern PR1, without technical problems associated with the deformation of the first color filter 122. Accordingly, the image sensor can provide an improved image quality.

FIGS. 20 through 25 are sectional views illustrating a method of fabricating an image sensor, according to other example embodiments of the inventive concept. In the following description of FIGS. 20 through 25, for the sake of brevity, a previously described element may be identified by a similar or identical reference number without repeating the description thereof.

Figure 20:
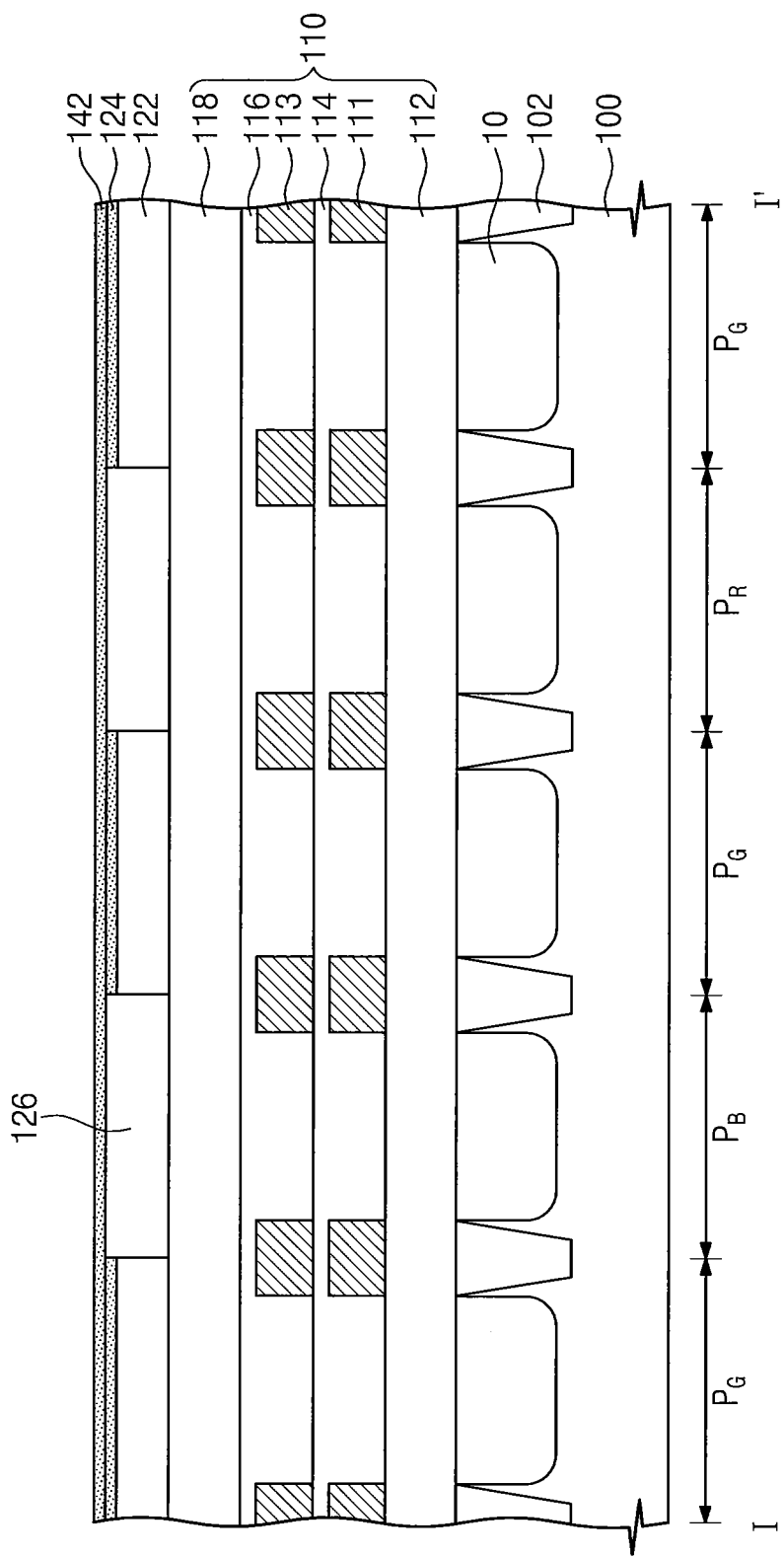
FIGS. 20 through 25 are sectional views illustrating a method of fabricating an image sensor, according to other example embodiments of the inventive concept.

Referring to FIG. 20, a second color filter 126 may be formed on the interlayered insulating structure 110, on which the first color filter 122 and the first protection pattern 124 are sequentially stacked. The formation of the second color filter 126 may include coating a second color filter layer (not shown) on the interlayered insulating structure 110 and planarizing the second color filter layer to expose a top surface of the first protection pattern 124. The second color filter 126 may be formed to fill gap regions on the blue and red pixel regions $P_B$ and $P_R$.

A second protection layer 142 may be formed on the second color filter 126. The second protection layer 142 may be formed to cover top surfaces of the second color filter 126 and the first protection pattern 124. The second protection layer 142 may be formed of the same material as the first protection pattern 124. For example, the second protection layer 142 may be formed of or include at least one of a silicon oxide layer, a silicon nitride layer, or a silicon oxynitride layer. The second protection layer 142 may be formed to have a thickness of about 500 Å or less.

Figure 21:
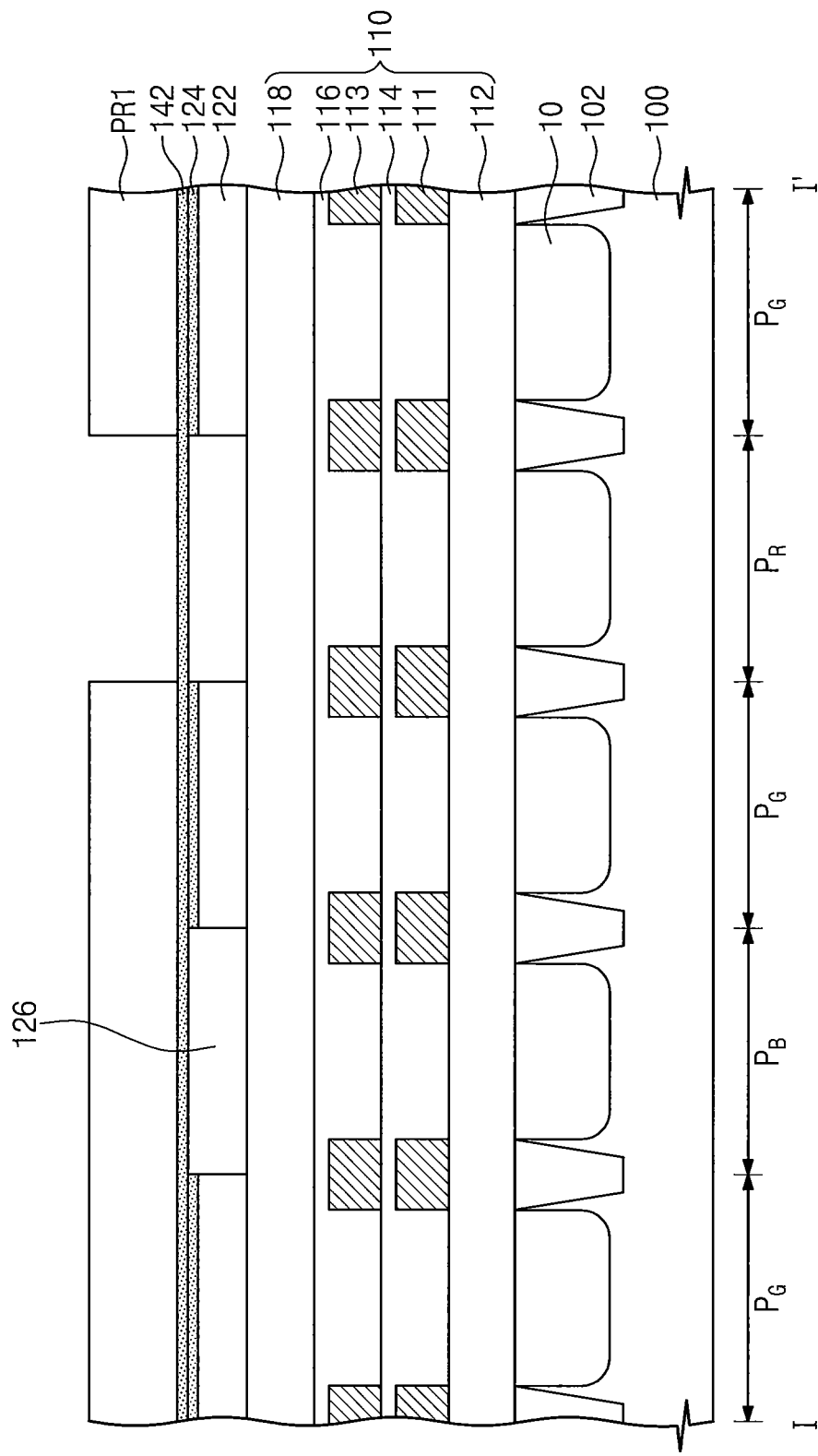

Referring to FIG. 21, a first photoresist pattern PR1 may be formed on the second protection layer 142. The first photoresist pattern PR1 may be formed to veil or cover the green and blue pixel regions $P_G$ and $P_B$ and expose the red pixel region $P_R$. In other words, on the red pixel region $P_R$, the second protection layer 142 may be exposed by the first photoresist pattern PR1.

Figure 22:
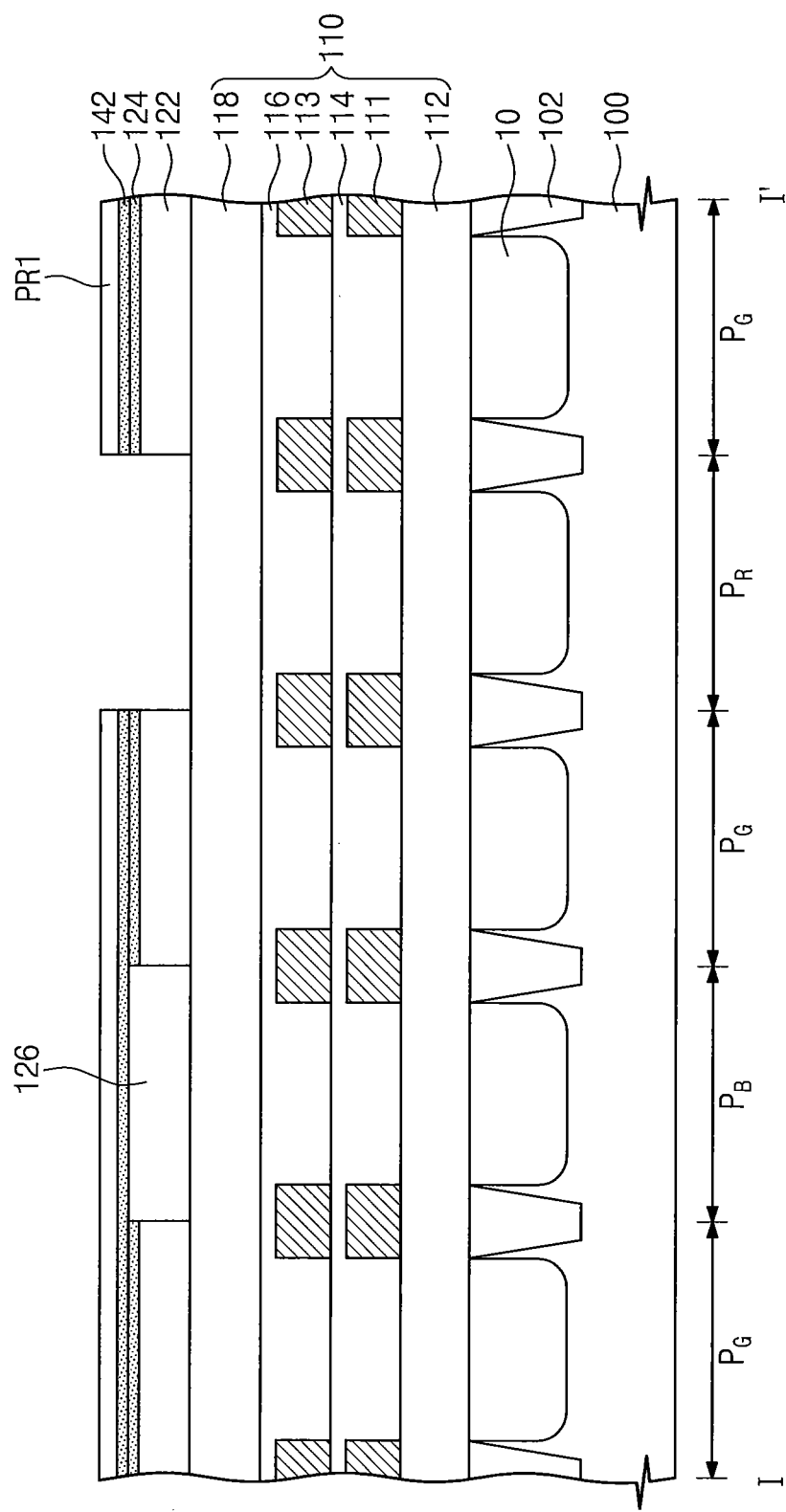

Referring to FIG. 22, a dry etching process may be performed to a portion of the second protection layer 142 exposed by the first photoresist pattern PR1. Accordingly, the second protection layer 142 and the second color filter 126 may be partially removed over the red pixel region $P_R$ to expose a top surface of the uppermost layer (e.g., the insulating layer 118) of the interlayered insulating structure 110 on the red pixel region $P_R$. In certain embodiments, the first photoresist pattern PR1 may be concurrently etched in the etching process. Alternatively, after the etching process, a portion of the first photoresist pattern PR1 may remain (as a residue) on the second protection layer 142.

Figure 23:
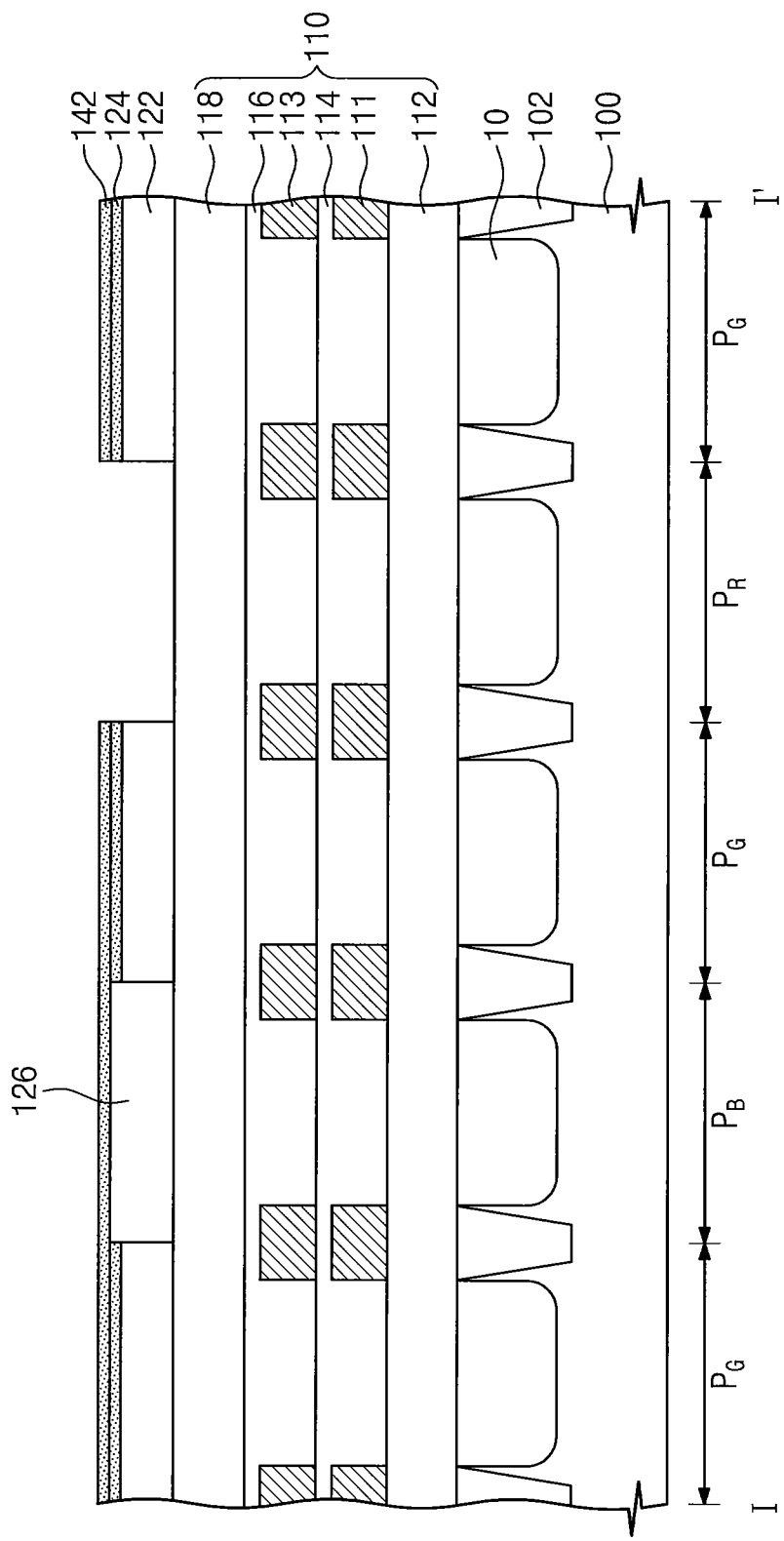

Referring to FIG. 23, the first photoresist pattern PR1 may be removed. The first photoresist pattern PR1 may be removed by, for example, an ashing process. The removal of the first photoresist pattern PR1 may be performed to expose a top surface of the second protection layer 142.

Figure 24:
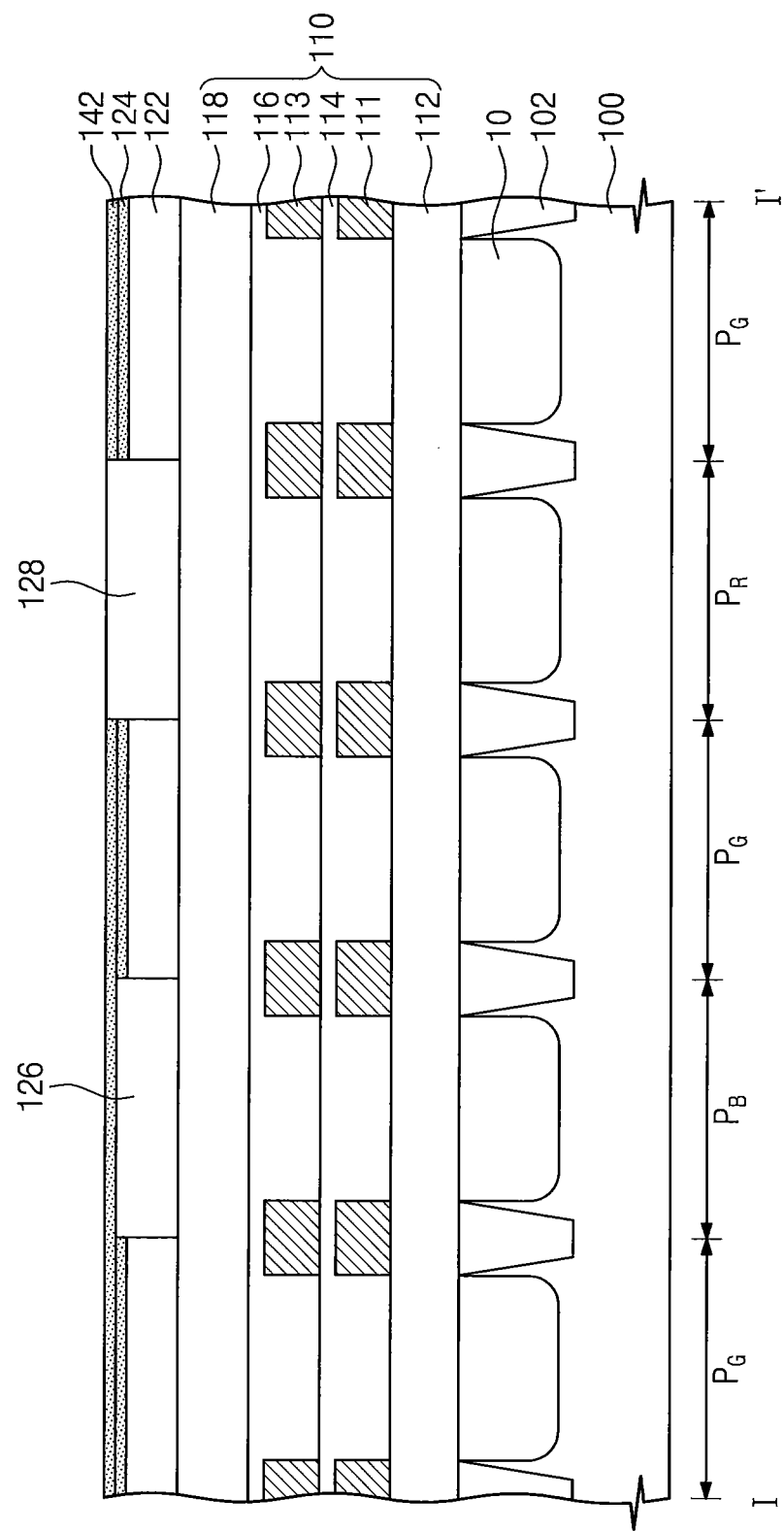

Referring to FIG. 24, a third color filter 128 may be formed on the interlayered insulating structure 110 to fill gap regions on the red pixel region $P_R$. The formation of the third color filter 128 may include coating a third color filter layer (not shown) on the interlayered insulating structure 110 and planarizing the third color filter layer to expose a top surface of the second protection layer 142.

Alternatively, as previously described with reference to FIGS. 16 and 18, the third color filter 128 may be formed using exposure and development processes. For example, unlike the first and second color filters 122 and 126, the third color filter 128 may be formed to have an outward or upward convex top surface.

Figure 25:
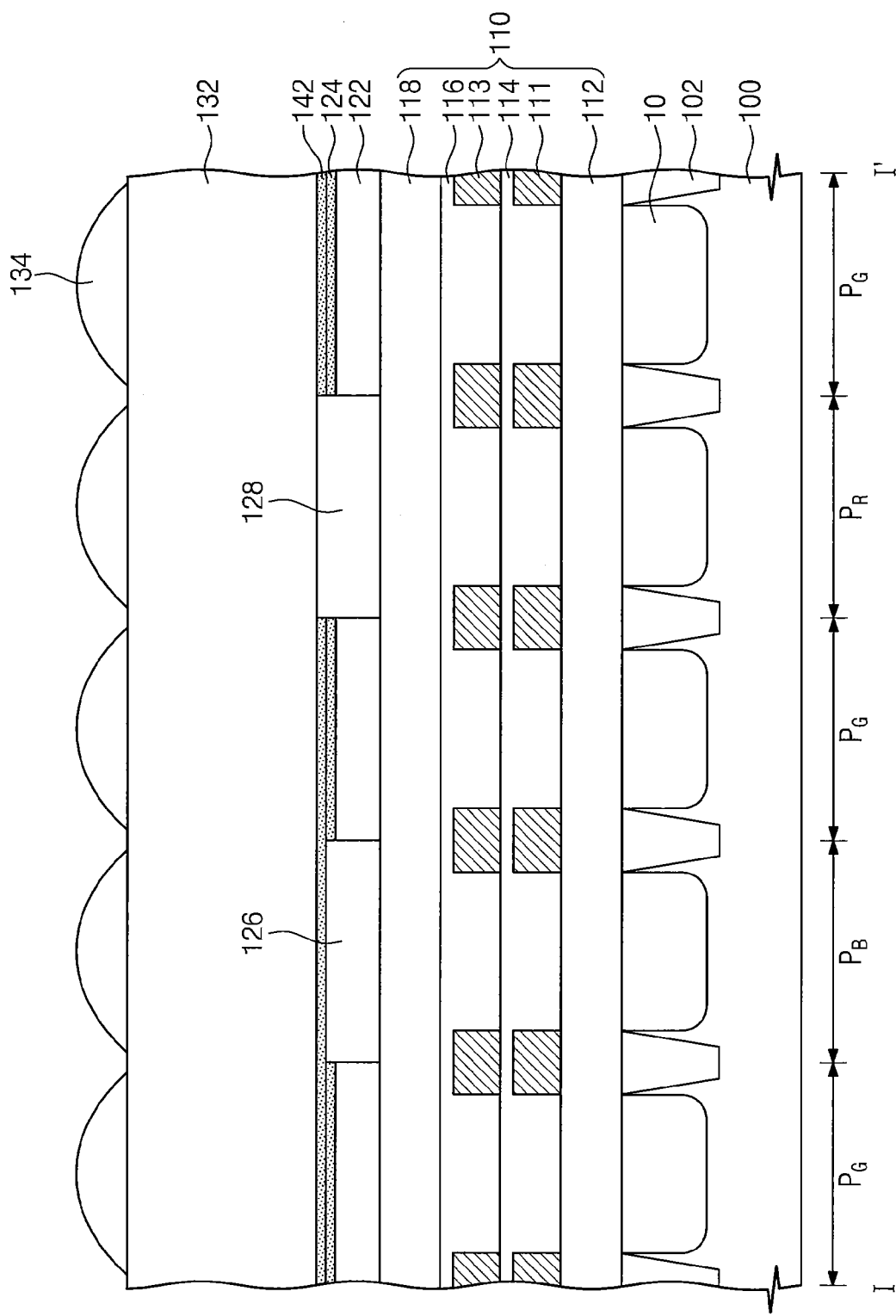

Referring to FIG. 25 in conjunction with FIG. 4, a light-transmission type photoresist layer 132 and a mask pattern 134 may be sequentially formed on the interlayered insulating structure 110 provided with the first to third color filters 122, 126, and 128. Thereafter, the light-transmission type photoresist layer 132 may be patterned using the mask pattern 134 as an etch mask to form the micro lens 136.

FIGS. 26 through 36 are sectional views illustrating a method of fabricating an image sensor, according to still other example embodiments of the inventive concept. In the following description of FIGS. 26 through 36, for the sake of brevity, a previously described element may be identified by a similar or identical reference number without repeating the description thereof.

Figure 26:
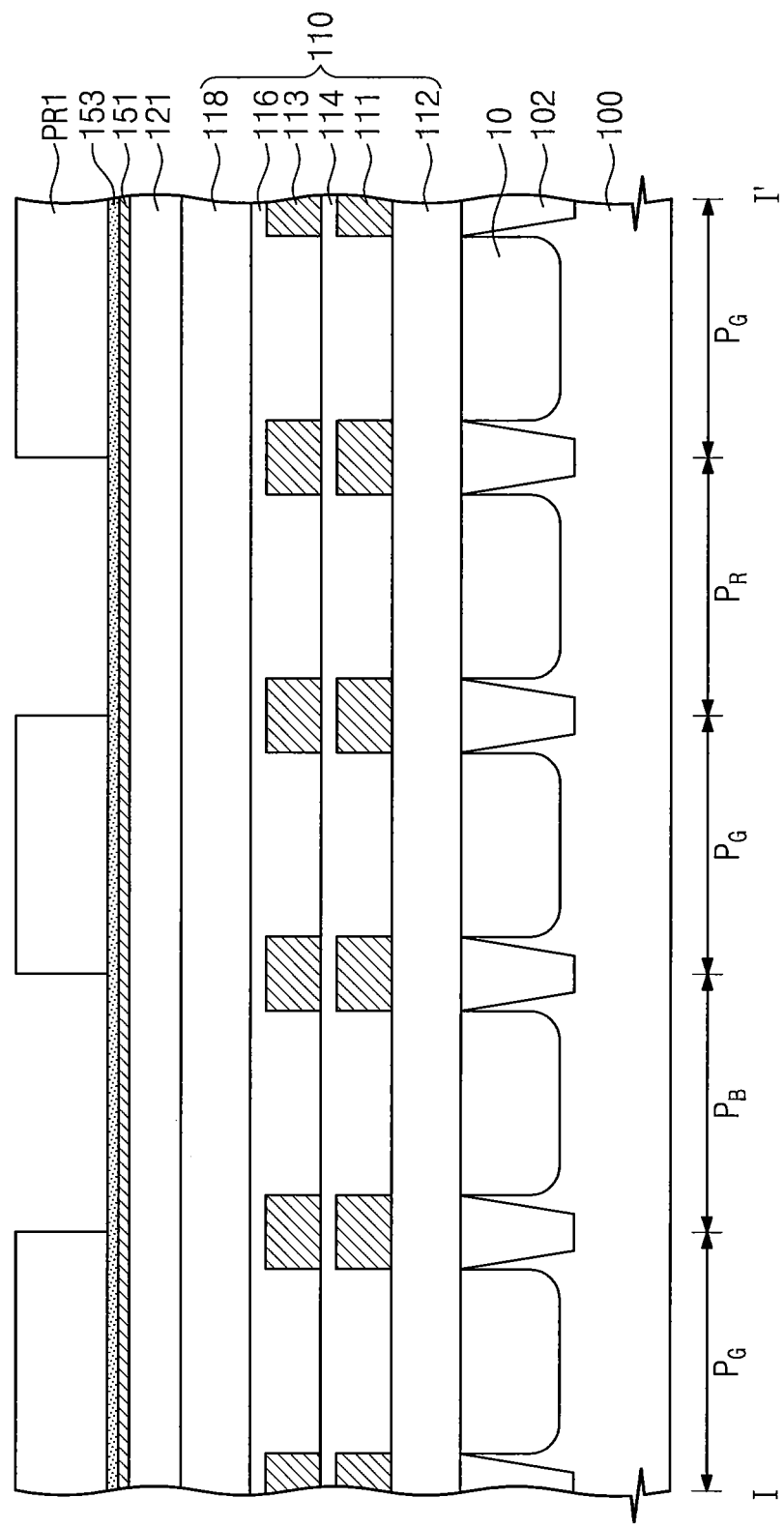
FIGS. 26 through 36 are sectional views illustrating a method of fabricating an image sensor, according to still other example embodiments of the inventive concept.

Referring to FIG. 26, the first color filter layer 121 may be formed on the interlayered insulating structure 110, and a first sacrificial layer 151 and a first protection layer 153 may be sequentially formed on the first color filter layer 121. The first sacrificial layer 151 may include a water-soluble polymer layer, in which polymer could be dissolved by water-soluble solution. For example, the first protection layer 153 may be formed of or include at least one of a silicon oxide layer, a silicon nitride layer, a silicon oxynitride layer, or a developable-bottom-anti-reflective coating (DBARC) layer. The first protection layer 153 may be formed to have a thickness of about 500 Å or less.

The first photoresist pattern PR1 may be formed on the first protection layer 153. The first photoresist pattern PR1 may be formed on the green pixel regions $P_G$.

Figure 27:
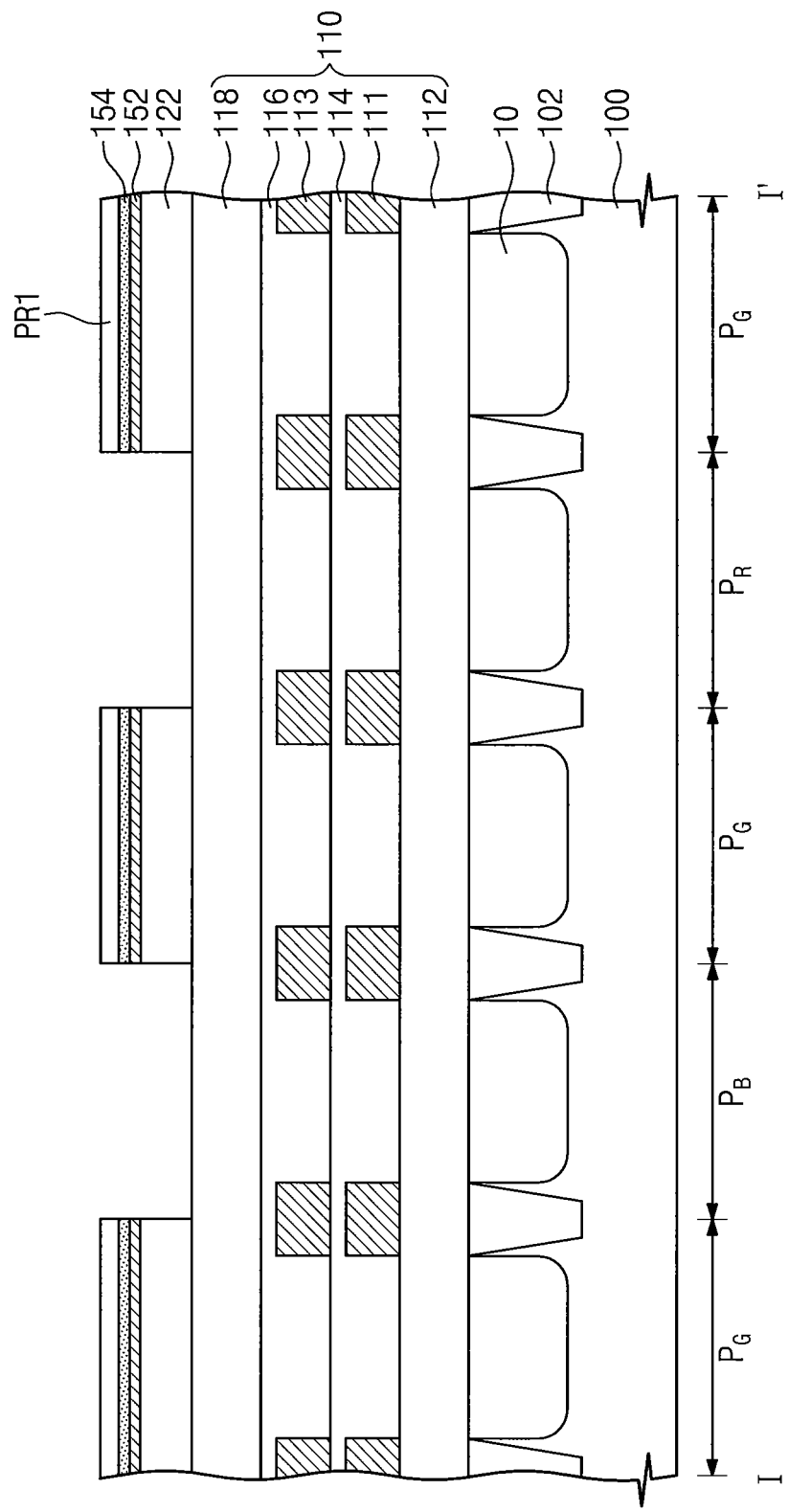
Figure 28:
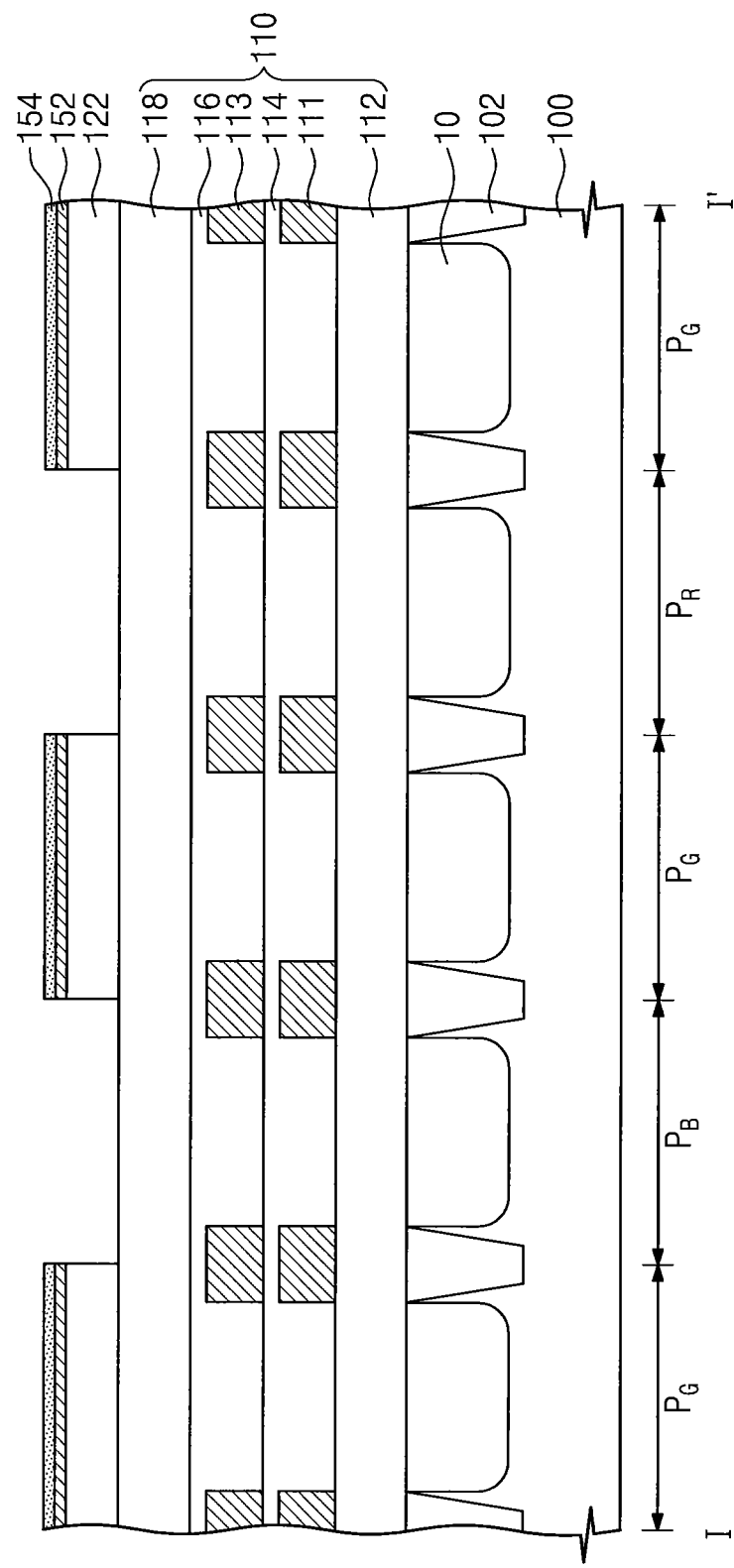

Referring to FIGS. 27 and 28, a dry etching process may be performed to the first photoresist pattern PR1 to sequentially etch the first protection layer 153, the first sacrificial layer 151, and the first color filter layer 121 exposed by the first photoresist pattern PR1. As a result, the first color filter 122, a first sacrificial pattern 152, and a first protection pattern 154 may be formed on each of the green pixel regions $P_G$.

After the etching process, an ashing process may be performed to remove a remaining portion of the first photoresist pattern PR1 from a top surface of the first protection pattern 154.

Alternatively, as previously illustrated in FIG. 10, the dry etching process may be performed to retain portions of the first color filter layer 121 on the blue and red pixel regions $P_B$ and $P_R$. The portions of the first color filter layer 121 remaining on the blue and red pixel regions $P_B$ and $P_R$ may be removed during the ashing process for removing the first photoresist pattern PR1.

Figure 29:
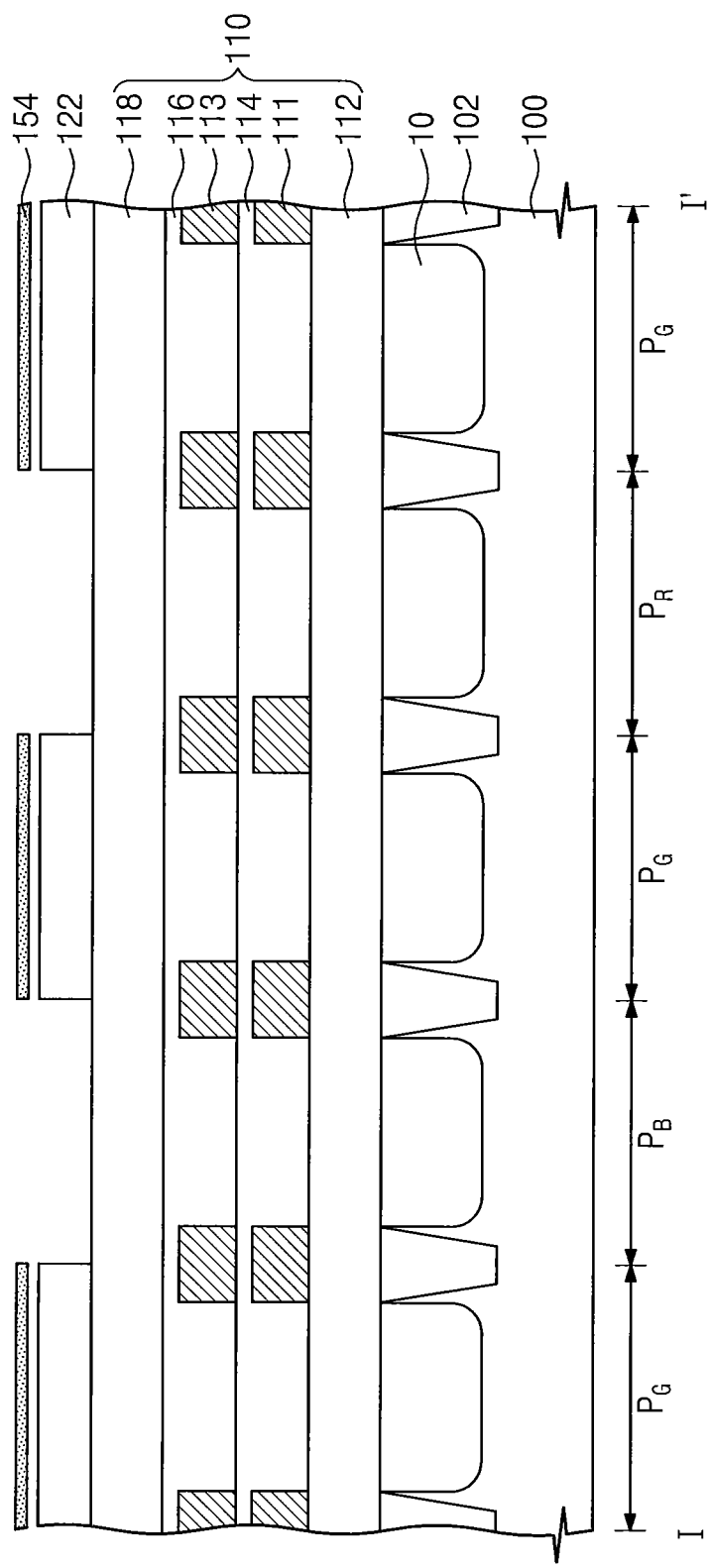
Figure 30:
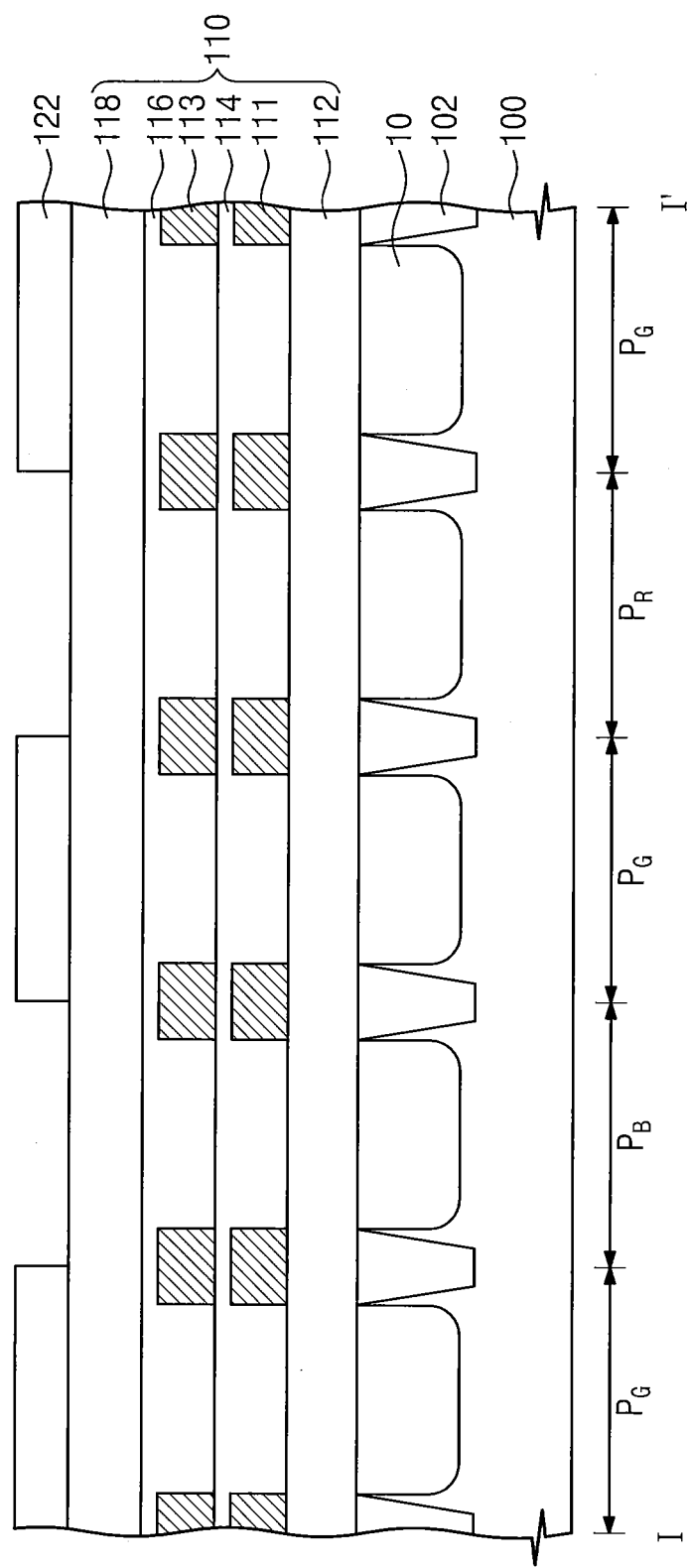

Referring to FIGS. 29 and 30, the first sacrificial pattern 152 may be selectively removed. For example, in the case where the first sacrificial pattern 152 is formed of the water-soluble polymer material, it may be dissolved by a deionized water cleaning process. As the result of the removal of the first sacrificial pattern 152, the first protection pattern 154 formed on the first sacrificial pattern 152 may be separated from the first color filter 122. Accordingly, the first color filter 122 may remain on the interlayered insulating structure 110 of the green pixel region $P_G$.

Figure 31:
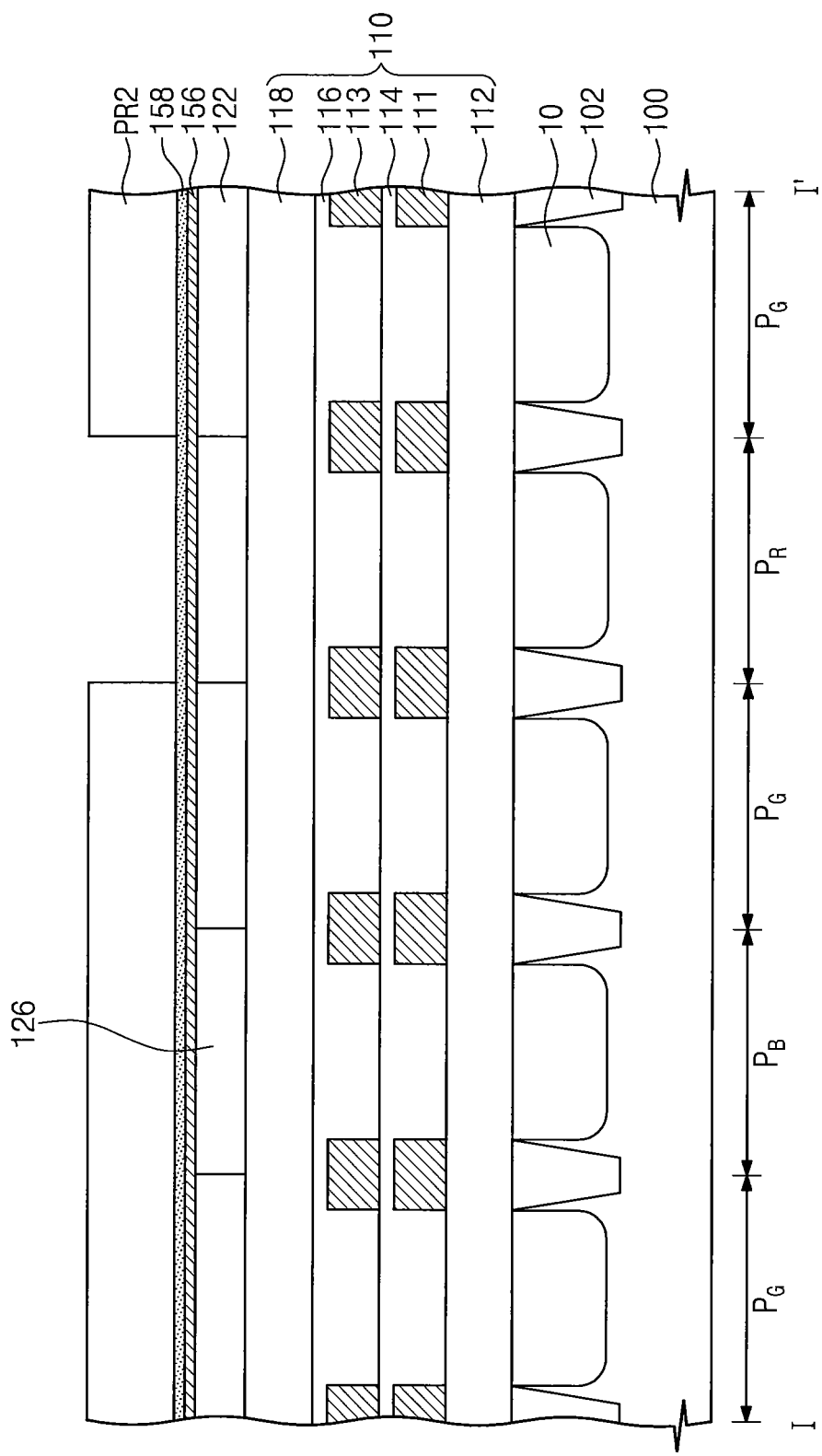

Referring to FIG. 31, the second color filters 126 may be formed between the green pixel regions $P_G$ to fill gap regions on the blue and red pixel regions $P_B$ and $P_R$. A second sacrificial layer 156, a second protection layer 158, and a second photoresist pattern PR2 may be sequentially formed on the interlayered insulating structure 110, on which the first and second color filters 122 and 126 are formed. The second sacrificial layer 156 may be formed of the same material as the first sacrificial layer 151. For example, the second sacrificial layer 156 may be formed of a water-soluble polymer layer. The second protection layer 158 may be formed of the same material as the first protection layer 153 and, for example, it may be formed of at least one of a silicon oxide layer, a silicon nitride layer, a silicon oxynitride layer, or a DBARC layer. The second protection layer 158 may be formed to have a thickness of about 500 Å or less.

The second photoresist pattern PR2 may be formed on the second protection layer 158 to cover or veil the green and the blue pixel regions $P_G$ and $P_B$ and expose the red pixel region $P_R$.

Figure 32:
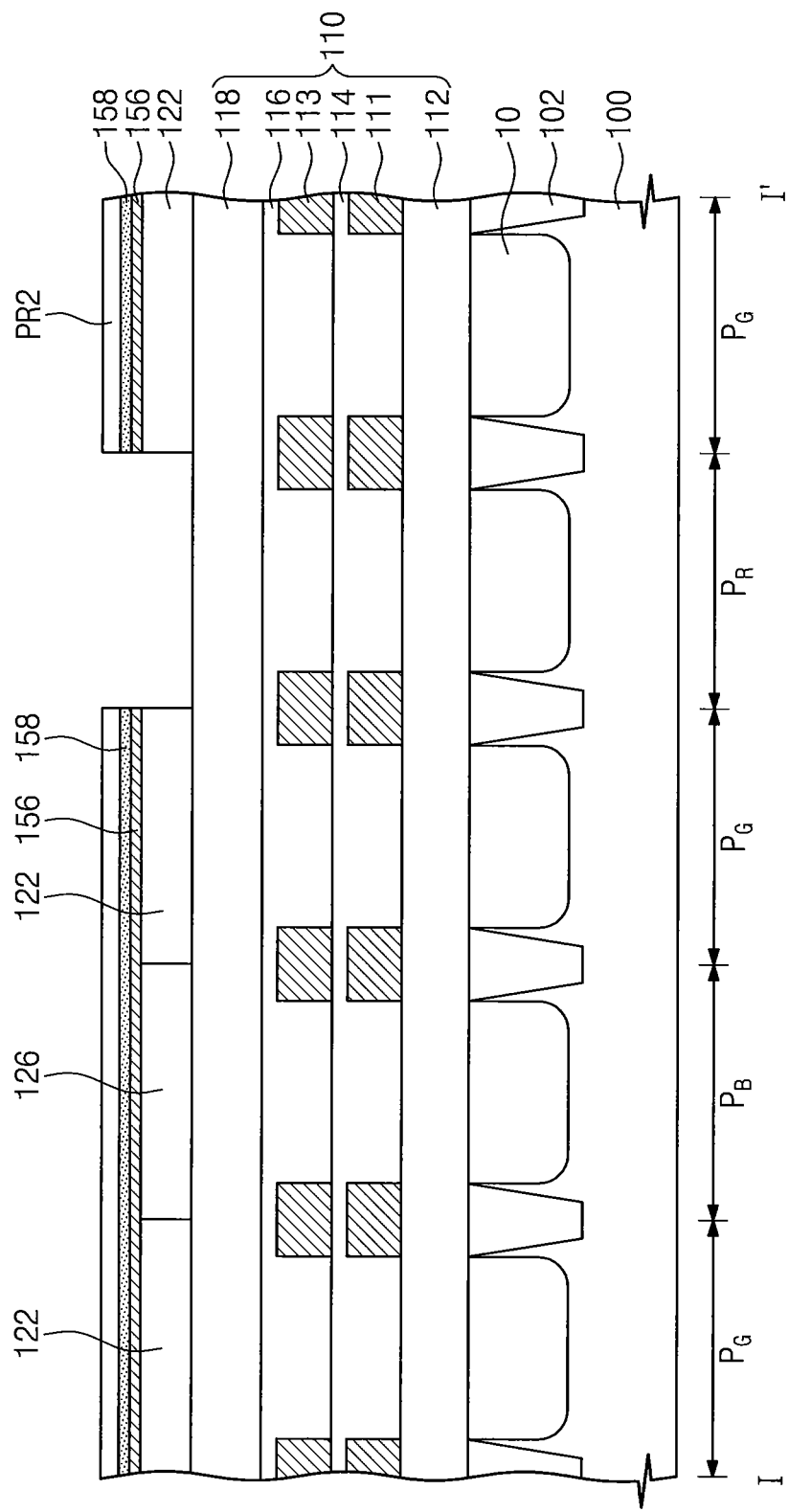
Figure 33:
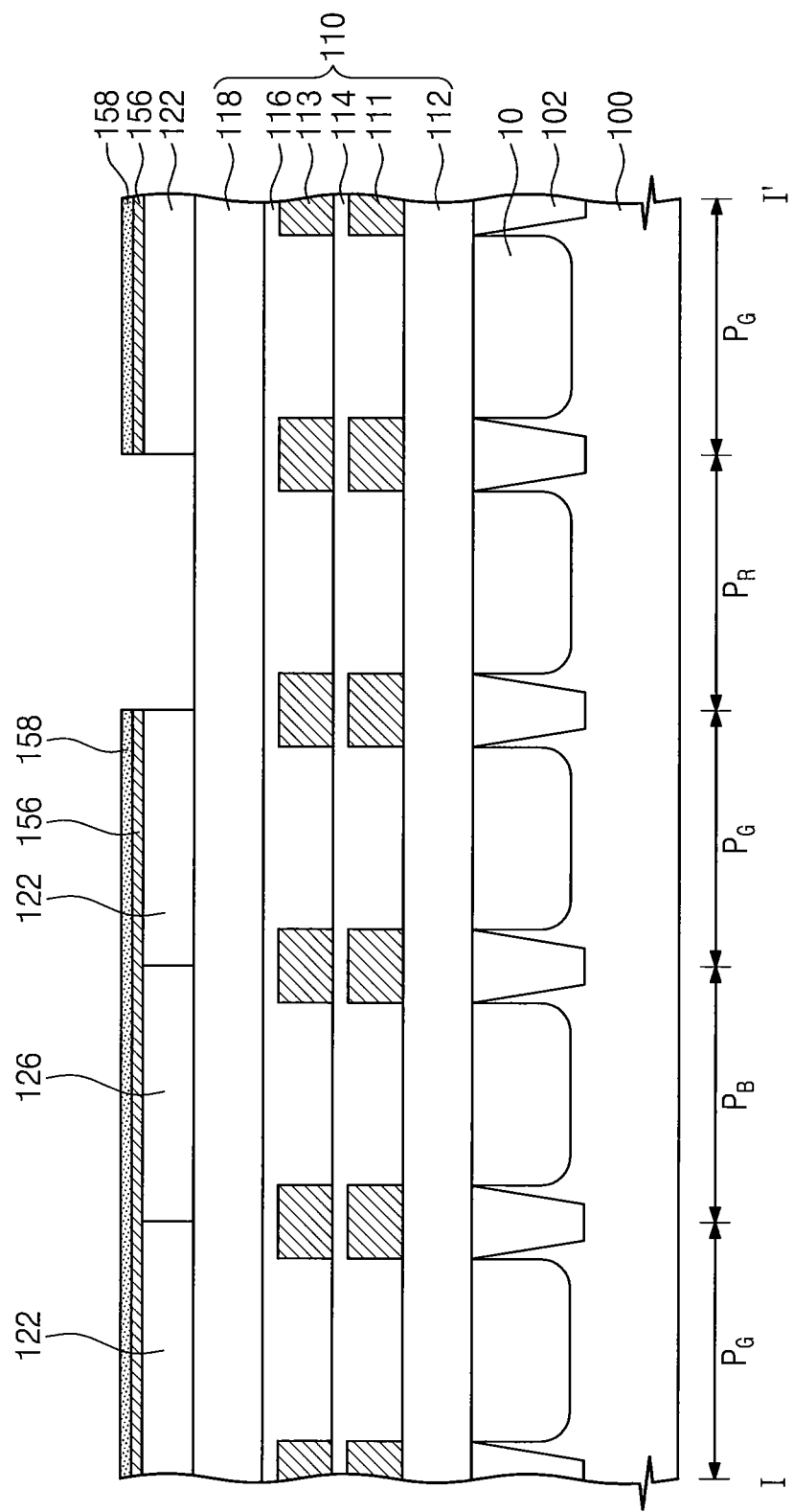

Referring to FIGS. 32 and 33, a dry etching process may be performed to the second photoresist pattern PR2 to sequentially etch the second protection layer 158, the second sacrificial layer 156, and the second color filter 126 exposed by the second photoresist pattern PR2. Accordingly, the second color filter 126, the second sacrificial layer 156, and the second protection layer 158 may be removed from the red pixel region $P_R$.

After the etching process, an ashing process may be performed to remove the second photoresist pattern PR2 remaining on the second protection layer 158.

Figure 34:
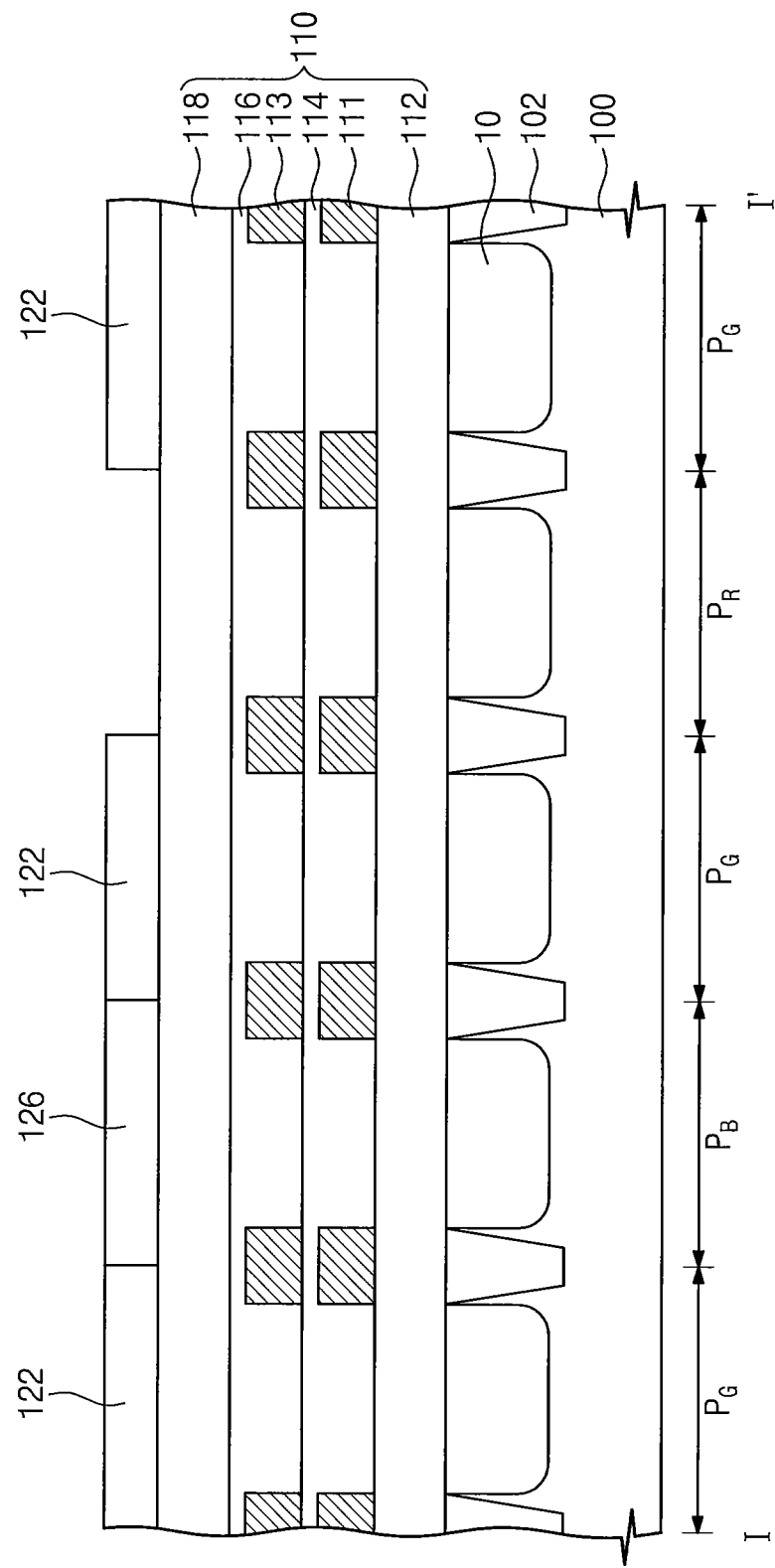

Referring to FIG. 34, the second sacrificial layer 156 may be removed by a deionized water cleaning process. As a result, the second protection layer 158 may be separated from the first and second color filters 122 and 126, and the second color filter 126 may remain on the interlayered insulating structure 110 of the blue pixel region $P_B$.

Figure 35:
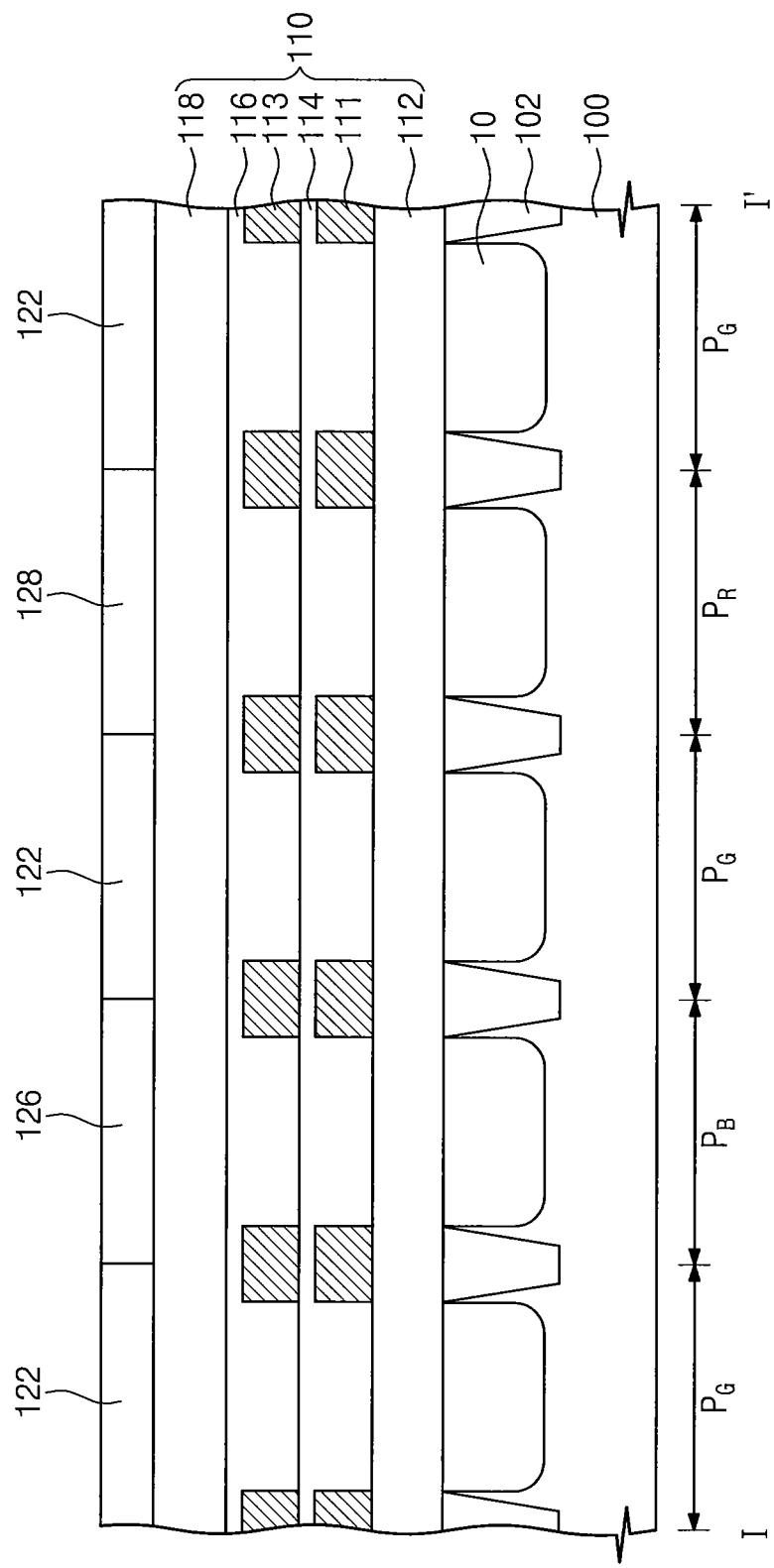
Figure 36:
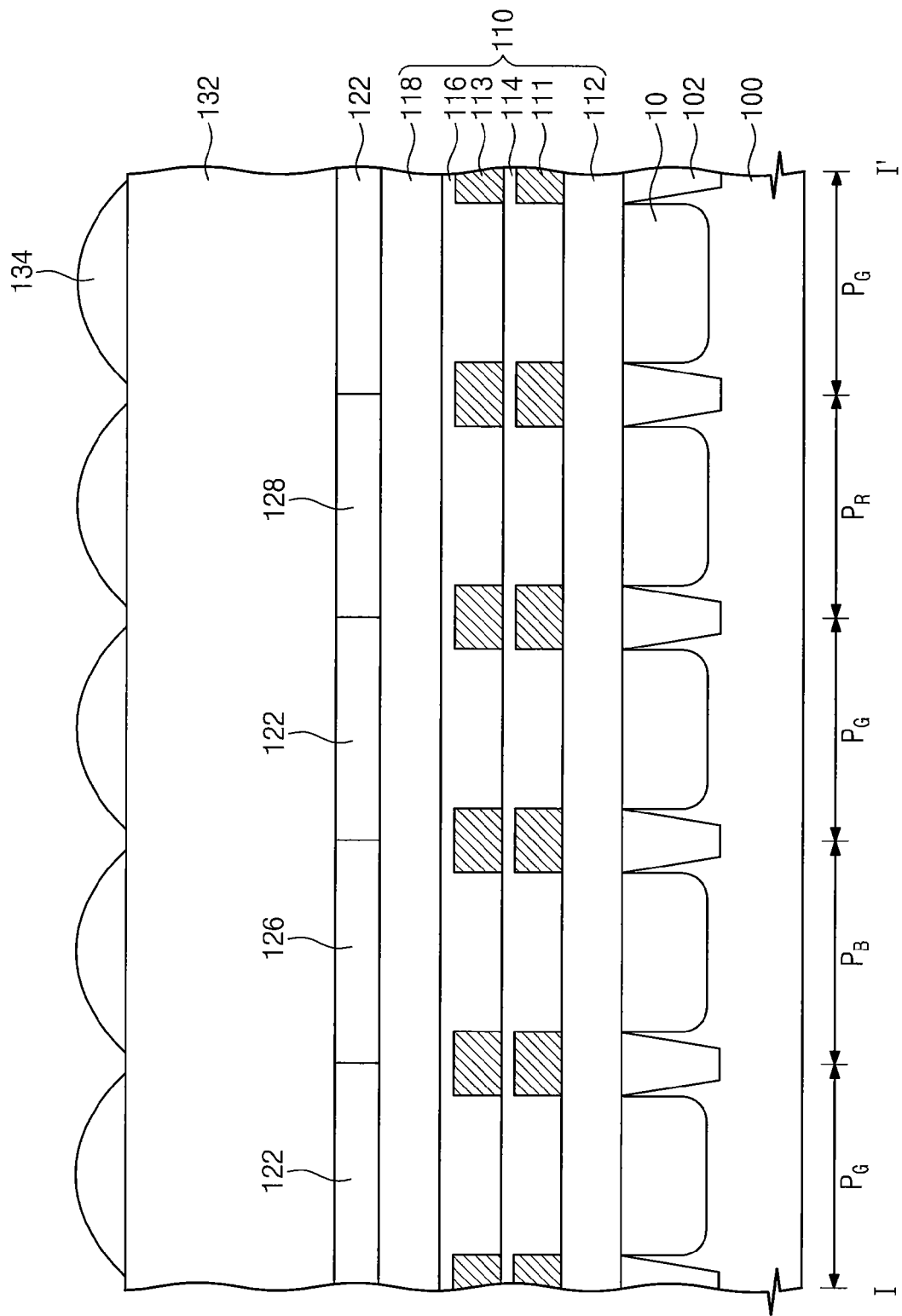

Referring to FIGS. 35 and 36 in conjunction with FIG. 5, the third color filters 128 may be formed on the interlayered insulating structure 110 to fill gap regions on the red pixel regions $P_R$.

The light-transmission type photoresist layer 132 and the mask pattern 134 may be sequentially formed on the interlayered insulating structure 110 provided with the first to third color filters 122, 126, and 128. Thereafter, the light-transmission type photoresist layer 132 may be patterned using the mask pattern 134 as an etch mask to form the micro lens 136.

According to example embodiments of the inventive concept, the first protection pattern 154 and the second protection layer 158 may prevent the first and second color filters 122 and 126 from being deformed, when the first and second photoresist patterns PR1 and PR2 are removed, and thus, the first sacrificial pattern 152 and second sacrificial layer 156 can make it possible to separate the first protection pattern 154 and the second protection layer 158 from the first and second color filters 122 and 126, without undesirable deformation of the first and second color filters 122 and 126. In other words, it is possible to prevent the first and second color filters 122 and 126 from being deformed and prevent a residue from remaining on the first and second color filters 122 and 126. Accordingly, a thickness of layers provided on the unit pixel regions can be decreased, and this makes it possible to improve an image quality of the image sensor.

Figure 37:
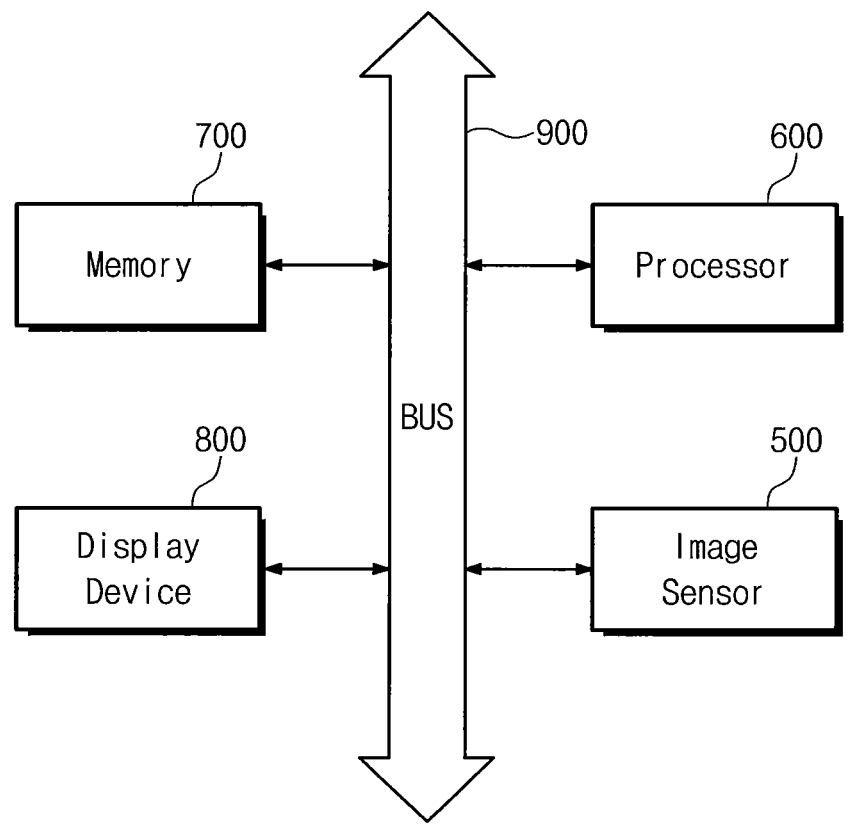
FIG. 37 is a block diagram illustrating exemplary electronic devices including an image sensor, according to example embodiments of the inventive concept.
Figure 38:
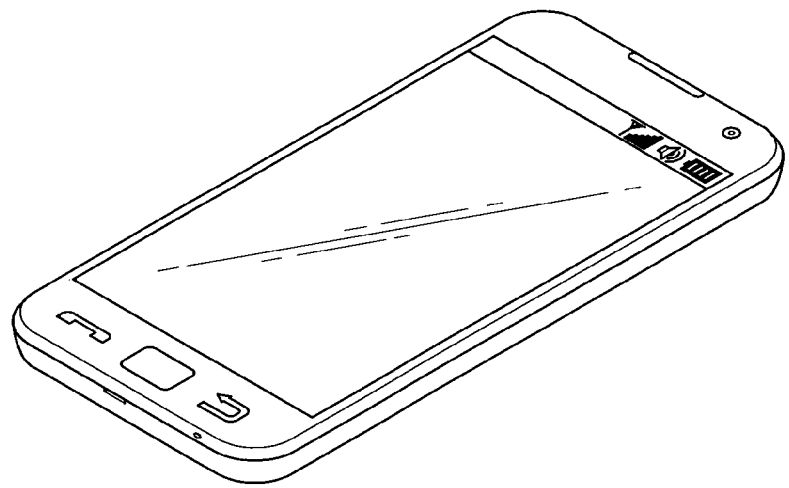
FIGS. 38 through 42 show examples of multimedia devices, to which image sensors according to example embodiments of the inventive concept can be applied.
Figure 39:
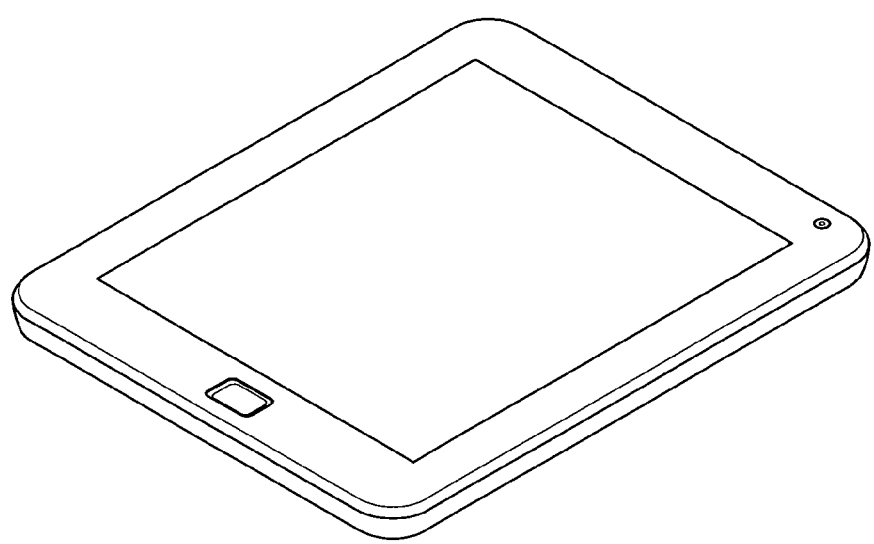
Figure 40:
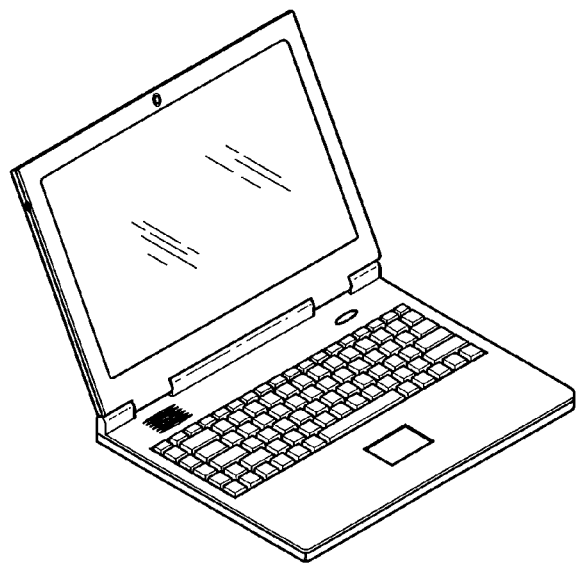
Figure 41:
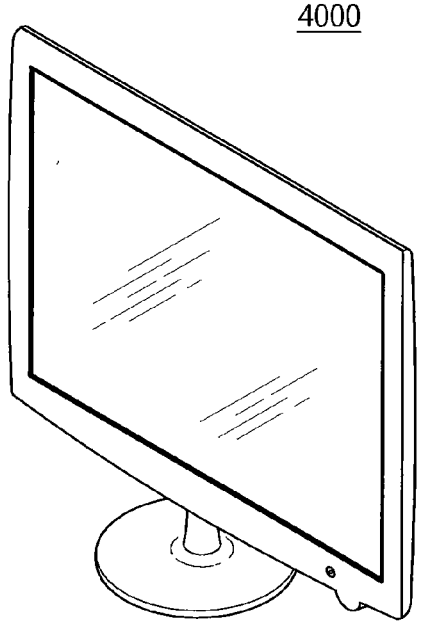
Figure 42:
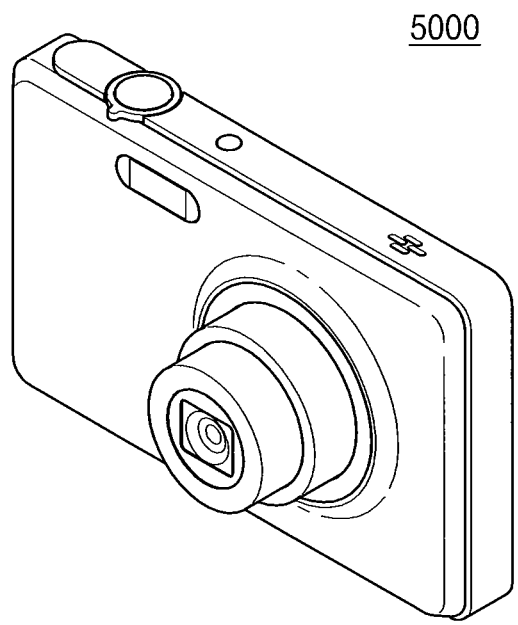

FIG. 37 is a block diagram illustrating exemplary electronic devices including an image sensor, according to example embodiments of the inventive concept.

The electronic device may be any of various types of devices, such as a digital camera or a mobile device, for example. Referring to FIG. 37, an illustrative digital camera system includes an image sensor 500, a processor 600, a memory 700, a display 800 and a bus 900. The image sensor 500 may capture an external image under control of the processor 600, and may provide the corresponding image data to the processor 600 through the bus 900. The processor 600 may store the image data in the memory 700 through the bus 900. The processor 600 may also output the image data stored in the memory 700, e.g., for display on the display device 800.

FIGS. 38 through 42 show examples of multimedia devices, in or to which image sensors according to example embodiments of the inventive concept can be applied.

Image sensors according to example embodiments of the inventive concept can be applied to a variety of multimedia devices with an imaging function. For example, image sensors according to example embodiments of the inventive concept may be applied to a mobile phone or a smart phone 1000 such as the one shown in FIG. 38, to a tablet PC or a smart tablet PC 2000 such as the one shown in FIG. 39, to a laptop computer 3000 such as the one shown in FIG. 40, to a television set or a smart television set 4000 such as the one shown in FIG. 41, and to a digital camera or a digital camcorder 5000 such as the one shown in FIG. 42.

According to example embodiments of the inventive concept, a method of fabricating an image sensor may include forming a protection layer on a color filter layer. The protection layer may prevent the color filter from being deformed when a photoresist pattern remaining after the formation of the color filter is removed.

According to other example embodiments of the inventive concept, a method of fabricating an image sensor may include sequentially forming a sacrificial layer and a protection layer on the color filter layer. The protection layer may prevent the color filter from being deformed when the photoresist pattern is removed. The sacrificial layer may be selectively removed, and this makes it possible to separate the protection layer from the color filter without deformation of the color filter. Further, this makes it possible to prevent a thickness of layers provided on the unit pixel regions from increasing and to improve an image quality of the image sensor.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating an image sensor, the method comprising:
   preparing a substrate with first, second and third pixel regions;
   coating a first color filter layer on the substrate;
   sequentially forming a first sacrificial layer and a first protection layer to cover the first color filter layer;
   forming a first photoresist pattern on the first protection layer to overlap the first pixel region;
   performing a first dry etching process to the first sacrificial layer and the first protection layer to form a first color filter, a first sacrificial pattern, and a first protection pattern sequentially stacked on the first pixel region, wherein the first photoresist pattern is used as an etch mask in the first dry etching process; and
   selectively removing the first sacrificial pattern to separate the first protection pattern from the first color filter.

2. The method of claim 1, wherein selectively removing the first sacrificial pattern is performed using a deionized water cleaning process.

3. The method of claim 1, wherein the first sacrificial layer comprises a water-soluble polymer material.

4. The method of claim 1, wherein the first protection layer comprises at least one of a silicon oxide layer, a silicon nitride layer, a silicon oxynitride layer, or a developable-bottom-anti-reflective coating (DBARC) layer.

5. The method of claim 1, wherein the first photoresist pattern is etched in the first dry etching process to have a reduced thickness after the first dry etching process.

6. The method of claim 5, further comprising performing an ashing process to remove the first photoresist pattern before the removing of the first sacrificial pattern.

7. The method of claim 6, wherein the first dry etching process is performed such that portions of the first color filter layer remain on the second and third pixel regions, and wherein the portions of the first color filter layer that remain on the second pixel region and the third pixel region are removed during the ashing process.

8. The method of claim 1, further comprising:
    forming a second color filter layer on the substrate provided with the first color filter;
    forming a second sacrificial layer and a second protection layer to cover the first and second color filter layers;
    forming a second photoresist pattern on the second protection layer to overlap the first and second pixel regions;
    performing a second dry etching process to the second protection layer and the second sacrificial layer to form a second color filter on the second pixel region and a second sacrificial pattern and a second protection pattern covering the first and second color filters, wherein the second photoresist pattern is used as an etch mask in the second dry etching process;
    selectively removing the second sacrificial pattern to separate the second protection pattern from the first and second color filters;
    forming a third color filter on the third pixel region; and
    forming a micro lens to cover the first, second and third color filters.

9. A method of fabricating an image sensor, the method comprising:
    providing a substrate comprising:
        first, second and third pixel regions; and
        a first color filter and a first protection layer sequentially stacked on the first pixel region;
    forming a second color filter on the second and third pixel regions to fill gap regions that are defined by the first color filter;
    forming a second protection layer to cover the second color filter and the first protection layer;
    forming a photoresist pattern on the second protection layer to cover the first and second pixel regions and to expose the third pixel region;
    performing a dry etching process on a portion of the second color filter exposed by the photoresist pattern to remove the second color filter and form gap regions on the third pixel region; and
    forming a third color filter to fill the gap regions on the third pixel region.

10. The method of claim 9, wherein the photoresist pattern is etched in the dry etching process to have a reduced thickness after the dry etching process, the method further comprising performing an ashing process to remove the photoresist pattern before forming the third color filter.

11. The method of claim 9, further comprising forming a micro lens to cover the first, second and third color filters.

12. The method of claim 9, wherein the second color filter is thicker than the first color filter and the third color filter is thicker than the second color filter.

13. The method of claim 12, wherein the second color filter has a top surface that is coplanar with a top surface of the first protection pattern, and the third color filter has a top surface that is coplanar with a top surface of the second protection layer.

* * * * *